US008658542B2

(12) United States Patent
Smayling et al.

(10) Patent No.: US 8,658,542 B2
(45) Date of Patent: Feb. 25, 2014

(54) COARSE GRID DESIGN METHODS AND STRUCTURES

(75) Inventors: Michael C. Smayling, Fremont, CA (US); Scott T. Becker, Scotts Valley, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 0 days.

(21) Appl. No.: 13/473,439

(22) Filed: May 16, 2012

(65) Prior Publication Data

US 2013/0130511 A1    May 23, 2013

Related U.S. Application Data

(63) Continuation-in-part of application No. 12/572,022, filed on Oct. 1, 2009, now Pat. No. 8,253,173, which is a continuation of application No. 12/212,562, filed on Sep. 17, 2008, now Pat. No. 7,842,975, which is a continuation of application No. 11/683,402, filed on Mar. 7, 2007, now Pat. No. 7,446,352, application No. 13/473,439, which is a continuation-in-part of application No. 13/073,994, filed on Mar. 28, 2011, now Pat. No. 8,356,268, which is a continuation of application No. 12/013,342, filed on Jan. 11, 2008, now Pat. No. 7,917,879, application No. 13/473,439, which is a continuation-in-part of application No. 12/753,795, filed on Apr. 2, 2010, now Pat. No. 8,258,581, which is a continuation of application No. 12/402,465, filed on Mar. 11, 2009, now Pat. No. 7,956,421.

(60) Provisional application No. 61/487,247, filed on May 17, 2011, provisional application No. 60/781,288, filed on Mar. 9, 2006, provisional application No. 60/963,364, filed on Aug. 2, 2007, provisional application No. 60/972,394, filed on Sep. 14, 2007, provisional application No. 61/036,460, filed on Mar. 13, 2008, provisional application No. 61/042,709, filed on Apr. 4, 2008, provisional application No. 61/045,953, filed on Apr. 17, 2008, provisional application No. 61/050,136, filed on May 2, 2008.

(51) Int. Cl.
 *H01L 21/461* (2006.01)

(52) U.S. Cl.
 USPC .................................. 438/725; 257/E21.517

(58) Field of Classification Search
 USPC ........... 438/487, 725, 942, 949; 257/E21.517
 See application file for complete search history.

(56) References Cited

U.S. PATENT DOCUMENTS 4,197,555 A    4/1980    Uehara et al.
4,417,161 A    11/1983    Uya (Continued)

FOREIGN PATENT DOCUMENTS

EP    0102644    7/1989
EP    0788166    8/1997

(Continued)

OTHER PUBLICATIONS

U.S. Appl. No. 60/625,342, Pileggi, et al., May 25, 2006.

(Continued)

*Primary Examiner* — Quoc Hoang
(74) *Attorney, Agent, or Firm* — Martine Penilla Group, LLP

(57) ABSTRACT

A layer of a mask material is deposited on a substrate. A beam of energy is scanned across the mask material in a rasterized linear pattern and in accordance with a scan pitch that is based on a pitch of conductive structure segments to be formed on the substrate. The beam of energy is defined to transform the mask material upon which the beam of energy is incident into a removable state. During scanning the beam of energy across the mask material, the beam of energy is turned on at locations where a conductive structure is to be formed on the substrate, and the beam of energy is turned off at locations where a conductive structure is not to be formed on the substrate.

20 Claims, 12 Drawing Sheets

(56) References Cited

U.S. PATENT DOCUMENTS

| | | |
|---|---|---|
| 4,424,460 A | 1/1984 | Best |
| 4,613,940 A | 9/1986 | Shenton et al. |
| 4,657,628 A | 4/1987 | Holloway et al. |
| 4,682,202 A | 7/1987 | Tanizawa |
| 4,745,084 A | 5/1988 | Rowson et al. |
| 4,780,753 A | 10/1988 | Ohkura et al. |
| 4,801,986 A | 1/1989 | Chang et al. |
| 4,804,636 A | 2/1989 | Groover, III |
| 4,812,688 A | 3/1989 | Chu et al. |
| 4,884,115 A | 11/1989 | Michel et al. |
| 4,928,160 A | 5/1990 | Crafts |
| 4,975,756 A | 12/1990 | Haken et al. |
| 5,068,603 A | 11/1991 | Mahoney |
| 5,079,614 A | 1/1992 | Khatakhotan |
| 5,097,422 A | 3/1992 | Corbin et al. |
| 5,117,277 A | 5/1992 | Yuyama et al. |
| 5,121,186 A | 6/1992 | Wong et al. |
| 5,208,765 A | 5/1993 | Turnbull |
| 5,224,057 A | 6/1993 | Igarashi |
| 5,242,770 A | 9/1993 | Chen et al. |
| 5,268,319 A | 12/1993 | Harari |
| 5,298,774 A | 3/1994 | Ueda et al. |
| 5,313,426 A | 5/1994 | Sakuma et al. |
| 5,351,197 A | 9/1994 | Upton et al. |
| 5,359,226 A | 10/1994 | DeJong |
| 5,365,454 A | 11/1994 | Nakagawa et al. |
| 5,367,187 A | 11/1994 | Yuen |
| 5,378,649 A | 1/1995 | Huang |
| 5,396,128 A | 3/1995 | Dunning et al. |
| 5,420,447 A | 5/1995 | Waggoner |
| 5,461,577 A | 10/1995 | Shaw et al. |
| 5,471,403 A | 11/1995 | Fujimaga |
| 5,497,334 A | 3/1996 | Russell et al. |
| 5,497,337 A | 3/1996 | Ponnapalli et al. |
| 5,526,307 A | 6/1996 | Lin et al. |
| 5,536,955 A | 7/1996 | Ali |
| 5,545,904 A | 8/1996 | Orbach |
| 5,581,098 A | 12/1996 | Chang |
| 5,581,202 A | 12/1996 | Yano et al. |
| 5,612,893 A | 3/1997 | Hao et al. |
| 5,636,002 A | 6/1997 | Garofalo |
| 5,656,861 A | 8/1997 | Godinho et al. |
| 5,682,323 A | 10/1997 | Pasch et al. |
| 5,684,311 A | 11/1997 | Shaw |
| 5,684,733 A | 11/1997 | Wu et al. |
| 5,698,873 A | 12/1997 | Colwell et al. |
| 5,705,301 A | 1/1998 | Garza et al. |
| 5,723,883 A | 3/1998 | Gheewalla |
| 5,723,908 A | 3/1998 | Fuchida et al. |
| 5,740,068 A | 4/1998 | Liebmann et al. |
| 5,745,374 A | 4/1998 | Matsumoto |
| 5,764,533 A | 6/1998 | deDood |
| 5,774,367 A | 6/1998 | Reyes et al. |
| 5,780,909 A | 7/1998 | Hayashi |
| 5,789,776 A | 8/1998 | Lancaster et al. |
| 5,790,417 A | 8/1998 | Chao et al. |
| 5,796,128 A | 8/1998 | Tran et al. |
| 5,796,624 A | 8/1998 | Sridhar et al. |
| 5,814,844 A | 9/1998 | Nagata et al. |
| 5,825,203 A | 10/1998 | Kusunoki et al. |
| 5,834,851 A | 11/1998 | Ikeda et al. |
| 5,838,594 A | 11/1998 | Kojima |
| 5,841,663 A | 11/1998 | Sharma et al. |
| 5,847,421 A | 12/1998 | Yamaguchi |
| 5,850,362 A | 12/1998 | Sakuma et al. |
| 5,852,562 A | 12/1998 | Shinomiya et al. |
| 5,858,580 A | 1/1999 | Wang et al. |
| 5,898,194 A | 4/1999 | Gheewala |
| 5,900,340 A | 5/1999 | Reich et al. |
| 5,908,827 A | 6/1999 | Sirna |
| 5,915,199 A | 6/1999 | Hsu |
| 5,917,207 A | 6/1999 | Colwell et al. |
| 5,920,486 A | 7/1999 | Beahm et al. |
| 5,923,059 A | 7/1999 | Gheewala |
| 5,923,060 A | 7/1999 | Gheewala |
| 5,929,469 A | 7/1999 | Mimoto et al. |
| 5,930,163 A | 7/1999 | Hara et al. |
| 5,935,763 A | 8/1999 | Caterer et al. |
| 5,949,101 A | 9/1999 | Aritome |
| 5,973,507 A | 10/1999 | Yamazaki |
| 5,977,305 A | 11/1999 | Wigler et al. |
| 5,977,574 A | 11/1999 | Schmitt et al. |
| 5,998,879 A | 12/1999 | Iwaki et al. |
| 6,009,251 A | 12/1999 | Ho et al. |
| 6,026,223 A | 2/2000 | Scepanovic et al. |
| 6,037,613 A | 3/2000 | Mariyama |
| 6,037,617 A | 3/2000 | Kumagai |
| 6,044,007 A | 3/2000 | Capodieci |
| 6,054,872 A | 4/2000 | Fudanuki et al. |
| 6,063,132 A | 5/2000 | DeCamp et al. |
| 6,077,310 A | 6/2000 | Yamamoto et al. |
| 6,080,206 A | 6/2000 | Tadokoro et al. |
| 6,084,437 A | 7/2000 | Sako |
| 6,091,845 A | 7/2000 | Pierrat et al. |
| 6,099,584 A | 8/2000 | Arnold et al. |
| 6,100,025 A | 8/2000 | Wigler et al. |
| 6,114,071 A | 9/2000 | Chen et al. |
| 6,144,227 A | 11/2000 | Sato |
| 6,166,415 A | 12/2000 | Sakemi et al. |
| 6,166,560 A | 12/2000 | Ogura et al. |
| 6,174,742 B1 | 1/2001 | Sudhindranath et al. |
| 6,182,272 B1 | 1/2001 | Andreev et al. |
| 6,194,104 B1 | 2/2001 | Hsu |
| 6,194,252 B1 | 2/2001 | Yamaguchi |
| 6,194,912 B1 | 2/2001 | Or-Bach |
| 6,209,123 B1 | 3/2001 | Maziasz et al. |
| 6,230,299 B1 | 5/2001 | McSherry et al. |
| 6,232,173 B1 | 5/2001 | Hsu et al. |
| 6,240,542 B1 | 5/2001 | Kapur |
| 6,249,902 B1 | 6/2001 | Igusa et al. |
| 6,255,600 B1 | 7/2001 | Schaper |
| 6,255,845 B1 | 7/2001 | Wong et al. |
| 6,262,487 B1 | 7/2001 | Igarashi et al. |
| 6,269,472 B1 | 7/2001 | Garza et al. |
| 6,275,973 B1 | 8/2001 | Wein |
| 6,282,696 B1 | 8/2001 | Garza et al. |
| 6,291,276 B1 | 9/2001 | Gonzalez |
| 6,297,668 B1 | 10/2001 | Schober |
| 6,297,674 B1 | 10/2001 | Kono et al. |
| 6,303,252 B1 | 10/2001 | Lin |
| 6,331,733 B1 | 12/2001 | Or-Bach et al. |
| 6,331,791 B1 | 12/2001 | Huang |
| 6,335,250 B1 | 1/2002 | Egi |
| 6,338,972 B1 | 1/2002 | Sudhindranath et al. |
| 6,347,062 B2 | 2/2002 | Nii et al. |
| 6,356,112 B1 | 3/2002 | Tran et al. |
| 6,359,804 B2 | 3/2002 | Kuriyama et al. |
| 6,370,679 B1 | 4/2002 | Chang et al. |
| 6,378,110 B1 | 4/2002 | Ho |
| 6,380,592 B2 | 4/2002 | Tooher et al. |
| 6,388,296 B1 | 5/2002 | Hsu |
| 6,393,601 B1 | 5/2002 | Tanaka et al. |
| 6,399,972 B1 | 6/2002 | Masuda et al. |
| 6,400,183 B2 | 6/2002 | Yamashita et al. |
| 6,415,421 B2 | 7/2002 | Anderson et al. |
| 6,416,907 B1 | 7/2002 | Winder et al. |
| 6,417,549 B1 | 7/2002 | Oh |
| 6,421,820 B1 | 7/2002 | Mansfield et al. |
| 6,425,112 B1 | 7/2002 | Bula et al. |
| 6,425,117 B1 | 7/2002 | Pasch et al. |
| 6,426,269 B1 | 7/2002 | Haffner et al. |
| 6,436,805 B1 | 8/2002 | Trivedi |
| 6,445,049 B1 | 9/2002 | Iranmanesh |
| 6,445,065 B1 | 9/2002 | Gheewala et al. |
| 6,467,072 B1 | 10/2002 | Yang et al. |
| 6,469,328 B2 | 10/2002 | Yanai et al. |
| 6,470,489 B1 | 10/2002 | Chang et al. |
| 6,476,493 B2 | 11/2002 | Or-Bach et al. |
| 6,477,695 B1 | 11/2002 | Gandhi |
| 6,480,032 B1 | 11/2002 | Aksamit |
| 6,480,989 B2 | 11/2002 | Chan et al. |
| 6,492,066 B1 | 12/2002 | Capodieci et al. |
| 6,496,965 B1 | 12/2002 | van Ginneken et al. |
| 6,504,186 B2 | 1/2003 | Kanamoto et al. |

(56) References Cited

U.S. PATENT DOCUMENTS

| | | |
|---|---|---|
| 6,505,327 B2 | 1/2003 | Lin |
| 6,505,328 B1 | 1/2003 | van Ginneken et al. |
| 6,507,941 B1 | 1/2003 | Leung et al. |
| 6,509,952 B1 | 1/2003 | Govil et al. |
| 6,514,849 B1 | 2/2003 | Hui et al. |
| 6,516,459 B1 | 2/2003 | Sahouria |
| 6,523,156 B2 | 2/2003 | Cirit |
| 6,525,350 B1 | 2/2003 | Kinoshita et al. |
| 6,536,028 B1 | 3/2003 | Katsioulas et al. |
| 6,543,039 B1 | 4/2003 | Watanabe |
| 6,553,544 B2 | 4/2003 | Tanaka et al. |
| 6,553,559 B2 | 4/2003 | Liebmann et al. |
| 6,553,562 B2 | 4/2003 | Capodieci et al. |
| 6,566,720 B2 | 5/2003 | Aldrich |
| 6,570,234 B1 | 5/2003 | Gardner |
| 6,571,140 B1 | 5/2003 | Wewalaarachchi |
| 6,571,379 B2 | 5/2003 | Takayama |
| 6,578,190 B2 | 6/2003 | Ferguson et al. |
| 6,588,005 B1 | 7/2003 | Kobayashi et al. |
| 6,590,289 B2 | 7/2003 | Shively |
| 6,591,207 B2 | 7/2003 | Naya et al. |
| 6,609,235 B2 | 8/2003 | Ramaswamy et al. |
| 6,610,607 B1 | 8/2003 | Armbrust et al. |
| 6,617,621 B1 | 9/2003 | Gheewala et al. |
| 6,620,561 B2 | 9/2003 | Winder et al. |
| 6,633,182 B2 | 10/2003 | Pileggi et al. |
| 6,635,935 B2 | 10/2003 | Makino |
| 6,642,744 B2 | 11/2003 | Or-Bach et al. |
| 6,643,831 B2 | 11/2003 | Chang et al. |
| 6,650,014 B2 | 11/2003 | Kariyazaki |
| 6,661,041 B2 | 12/2003 | Keeth |
| 6,662,350 B2 | 12/2003 | Fried et al. |
| 6,664,587 B2 | 12/2003 | Guterman et al. |
| 6,673,638 B1 | 1/2004 | Bendik et al. |
| 6,677,649 B2 | 1/2004 | Minami et al. |
| 6,687,895 B2 | 2/2004 | Zhang |
| 6,691,297 B1 | 2/2004 | Misaka et al. |
| 6,700,405 B1 | 3/2004 | Hirairi |
| 6,703,170 B1 | 3/2004 | Pindo |
| 6,709,880 B2 | 3/2004 | Yamamoto et al. |
| 6,714,903 B1 | 3/2004 | Chu et al. |
| 6,732,338 B2 | 5/2004 | Crouse et al. |
| 6,732,344 B2 | 5/2004 | Sakamoto et al. |
| 6,737,199 B1 | 5/2004 | Hsieh |
| 6,737,318 B2 | 5/2004 | Murata et al. |
| 6,737,347 B1 | 5/2004 | Houston et al. |
| 6,745,372 B2 | 6/2004 | Cote et al. |
| 6,745,380 B2 | 6/2004 | Bodendorf et al. |
| 6,749,972 B2 | 6/2004 | Yu |
| 6,750,555 B2 | 6/2004 | Satomi et al. |
| 6,760,269 B2 | 7/2004 | Nakase et al. |
| 6,765,245 B2 | 7/2004 | Bansal |
| 6,777,138 B2 | 8/2004 | Pierrat et al. |
| 6,777,146 B1 | 8/2004 | Samuels |
| 6,787,823 B2 | 9/2004 | Shibutani |
| 6,789,244 B1 | 9/2004 | Dasasathyan et al. |
| 6,789,246 B1 | 9/2004 | Mohan et al. |
| 6,792,591 B2 | 9/2004 | Shi et al. |
| 6,792,593 B2 | 9/2004 | Takashima et al. |
| 6,794,677 B2 | 9/2004 | Tamaki et al. |
| 6,794,914 B2 | 9/2004 | Sani et al. |
| 6,795,332 B2 | 9/2004 | Yamaoka et al. |
| 6,795,358 B2 | 9/2004 | Tanaka et al. |
| 6,795,952 B1 | 9/2004 | Stine et al. |
| 6,795,953 B2 | 9/2004 | Bakarian et al. |
| 6,800,883 B2 | 10/2004 | Furuya et al. |
| 6,807,663 B2 | 10/2004 | Cote et al. |
| 6,809,399 B2 | 10/2004 | Ikeda et al. |
| 6,812,155 B2 * | 11/2004 | Fujimoto ............... 438/725 |
| 6,812,574 B2 | 11/2004 | Tomita et al. |
| 6,818,389 B2 | 11/2004 | Fritze et al. |
| 6,818,929 B2 | 11/2004 | Tsutsumi et al. |
| 6,819,136 B2 | 11/2004 | Or-Bach |
| 6,826,738 B2 | 11/2004 | Cadouri |
| 6,834,375 B1 | 12/2004 | Stine et al. |
| 6,841,880 B2 | 1/2005 | Matsumoto et al. |
| 6,850,854 B2 | 2/2005 | Naya et al. |
| 6,854,096 B2 | 2/2005 | Eaton et al. |
| 6,854,100 B1 | 2/2005 | Chuang et al. |
| 6,871,338 B2 | 3/2005 | Yamauchi |
| 6,872,990 B1 | 3/2005 | Kang |
| 6,877,144 B1 | 4/2005 | Rittman et al. |
| 6,881,523 B2 | 4/2005 | Smith |
| 6,884,712 B2 | 4/2005 | Yelehanka et al. |
| 6,885,045 B2 | 4/2005 | Hidaka |
| 6,889,370 B1 | 5/2005 | Kerzman et al. |
| 6,897,517 B2 | 5/2005 | Houdt et al. |
| 6,897,536 B2 | 5/2005 | Nomura et al. |
| 6,898,770 B2 | 5/2005 | Boluki et al. |
| 6,904,582 B1 | 6/2005 | Rittman et al. |
| 6,918,104 B2 | 7/2005 | Pierrat et al. |
| 6,920,079 B2 | 7/2005 | Shibayama |
| 6,921,982 B2 | 7/2005 | Joshi et al. |
| 6,922,354 B2 | 7/2005 | Ishikura et al. |
| 6,924,560 B2 | 8/2005 | Wang et al. |
| 6,928,635 B2 | 8/2005 | Pramanik et al. |
| 6,931,617 B2 | 8/2005 | Sanie et al. |
| 6,953,956 B2 | 10/2005 | Or-Bach et al. |
| 6,954,918 B2 | 10/2005 | Houston |
| 6,957,402 B2 | 10/2005 | Templeton et al. |
| 6,968,527 B2 | 11/2005 | Pierrat |
| 6,974,978 B1 | 12/2005 | Possley |
| 6,977,856 B2 | 12/2005 | Tanaka et al. |
| 6,978,436 B2 | 12/2005 | Cote et al. |
| 6,978,437 B1 | 12/2005 | Rittman et al. |
| 6,980,211 B2 | 12/2005 | Lin et al. |
| 6,992,394 B2 | 1/2006 | Park |
| 6,992,925 B2 | 1/2006 | Peng |
| 6,993,741 B2 | 1/2006 | Liebmann et al. |
| 6,994,939 B1 | 2/2006 | Ghandehari et al. |
| 7,003,068 B2 | 2/2006 | Kushner et al. |
| 7,009,862 B2 | 3/2006 | Higeta et al. |
| 7,016,214 B2 | 3/2006 | Kawamata et al. |
| 7,022,559 B2 | 4/2006 | Barnak et al. |
| 7,028,285 B2 | 4/2006 | Cote et al. |
| 7,041,568 B2 | 5/2006 | Goldbach et al. |
| 7,052,972 B2 | 5/2006 | Sandhu et al. |
| 7,053,424 B2 | 5/2006 | Ono |
| 7,063,920 B2 | 6/2006 | Baba-Ali |
| 7,064,068 B2 | 6/2006 | Chou et al. |
| 7,065,731 B2 | 6/2006 | Jacques et al. |
| 7,079,989 B2 | 7/2006 | Wimer |
| 7,093,208 B2 | 8/2006 | Williams et al. |
| 7,093,228 B2 | 8/2006 | Andreev et al. |
| 7,103,870 B2 | 9/2006 | Misaka et al. |
| 7,105,871 B2 | 9/2006 | Or-Bach et al. |
| 7,107,551 B1 | 9/2006 | de Dood et al. |
| 7,115,343 B2 | 10/2006 | Gordon et al. |
| 7,115,920 B2 | 10/2006 | Bernstein et al. |
| 7,120,882 B2 | 10/2006 | Kotani et al. |
| 7,124,386 B2 | 10/2006 | Smith et al. |
| 7,126,837 B1 | 10/2006 | Banachowicz et al. |
| 7,132,203 B2 | 11/2006 | Pierrat |
| 7,137,092 B2 | 11/2006 | Maeda |
| 7,141,853 B2 | 11/2006 | Campbell et al. |
| 7,143,380 B1 | 11/2006 | Anderson et al. |
| 7,149,999 B2 | 12/2006 | Kahng et al. |
| 7,152,215 B2 | 12/2006 | Smith et al. |
| 7,155,685 B2 | 12/2006 | Mori et al. |
| 7,155,689 B2 | 12/2006 | Pierrat et al. |
| 7,159,197 B2 | 1/2007 | Falbo et al. |
| 7,174,520 B2 | 2/2007 | White et al. |
| 7,175,940 B2 | 2/2007 | Laidig et al. |
| 7,176,508 B2 | 2/2007 | Joshi et al. |
| 7,177,215 B2 | 2/2007 | Tanaka et al. |
| 7,185,294 B2 | 2/2007 | Zhang |
| 7,188,322 B2 | 3/2007 | Cohn et al. |
| 7,194,712 B2 | 3/2007 | Wu |
| 7,200,835 B2 | 4/2007 | Zhang et al. |
| 7,202,517 B2 | 4/2007 | Dixit et al. |
| 7,208,794 B2 | 4/2007 | Hofmann et al. |
| 7,214,579 B2 | 5/2007 | Widdershoven et al. |
| 7,219,326 B2 | 5/2007 | Reed et al. |
| 7,221,031 B2 | 5/2007 | Ryoo et al. |

(56) References Cited

U.S. PATENT DOCUMENTS

| | | |
|---|---|---|
| 7,225,423 B2 | 5/2007 | Bhattacharya et al. |
| 7,227,183 B2 | 6/2007 | Donze et al. |
| 7,228,510 B2 | 6/2007 | Ono |
| 7,231,628 B2 | 6/2007 | Pack et al. |
| 7,235,424 B2 | 6/2007 | Chen et al. |
| 7,243,316 B2 | 7/2007 | White et al. |
| 7,252,909 B2 | 8/2007 | Shin et al. |
| 7,264,990 B2 | 9/2007 | Rueckes et al. |
| 7,269,803 B2 | 9/2007 | Khakzadi et al. |
| 7,278,118 B2 | 10/2007 | Pileggi et al. |
| 7,279,727 B2 | 10/2007 | Ikoma et al. |
| 7,287,320 B2 | 10/2007 | Wang et al. |
| 7,294,534 B2 | 11/2007 | Iwaki |
| 7,302,651 B2 | 11/2007 | Allen et al. |
| 7,308,669 B2 | 12/2007 | Buehler et al. |
| 7,312,003 B2 | 12/2007 | Cote et al. |
| 7,315,994 B2 | 1/2008 | Aller et al. |
| 7,327,591 B2 | 2/2008 | Sadra et al. |
| 7,329,938 B2 | 2/2008 | Kinoshita |
| 7,335,966 B2 | 2/2008 | Ihme et al. |
| 7,337,421 B2 | 2/2008 | Kamat |
| 7,338,896 B2 | 3/2008 | Vanhaelemeersch et al. |
| 7,345,909 B2 | 3/2008 | Chang et al. |
| 7,346,885 B2 | 3/2008 | Semmler |
| 7,350,183 B2 | 3/2008 | Cui et al. |
| 7,353,492 B2 | 4/2008 | Gupta et al. |
| 7,360,179 B2 | 4/2008 | Smith et al. |
| 7,360,198 B2 | 4/2008 | Rana et al. |
| 7,366,997 B1 | 4/2008 | Rahmat et al. |
| 7,367,008 B2 | 4/2008 | White et al. |
| 7,376,931 B2 | 5/2008 | Kokubun |
| 7,383,521 B2 | 6/2008 | Smith et al. |
| 7,397,260 B2 | 7/2008 | Chanda et al. |
| 7,400,627 B2 | 7/2008 | Wu et al. |
| 7,402,848 B2 | 7/2008 | Chang et al. |
| 7,404,154 B1 | 7/2008 | Venkatraman et al. |
| 7,404,173 B2 | 7/2008 | Wu et al. |
| 7,411,252 B2 | 8/2008 | Anderson et al. |
| 7,421,678 B2 | 9/2008 | Barnes et al. |
| 7,423,298 B2 | 9/2008 | Mariyama et al. |
| 7,424,694 B2 | 9/2008 | Ikeda |
| 7,424,695 B2 | 9/2008 | Tamura et al. |
| 7,426,710 B2 | 9/2008 | Zhang et al. |
| 7,432,562 B2 | 10/2008 | Bhattacharyya |
| 7,434,185 B2 | 10/2008 | Dooling et al. |
| 7,441,211 B1 | 10/2008 | Gupta et al. |
| 7,442,630 B2 | 10/2008 | Kelberlau et al. |
| 7,444,609 B2 | 10/2008 | Charlebois et al. |
| 7,446,352 B2 | 11/2008 | Becker et al. |
| 7,449,371 B2 | 11/2008 | Kemerling et al. |
| 7,458,045 B2 | 11/2008 | Cote et al. |
| 7,459,792 B2 | 12/2008 | Chen |
| 7,465,973 B2 | 12/2008 | Chang et al. |
| 7,466,607 B2 | 12/2008 | Hollis et al. |
| 7,469,396 B2 | 12/2008 | Hayashi et al. |
| 7,480,880 B2 | 1/2009 | Visweswariah et al. |
| 7,480,891 B2 | 1/2009 | Sezginer |
| 7,484,197 B2 | 1/2009 | Allen et al. |
| 7,485,934 B2 | 2/2009 | Liaw |
| 7,487,475 B1 | 2/2009 | Kriplani et al. |
| 7,500,211 B2 | 3/2009 | Komaki |
| 7,502,275 B2 | 3/2009 | Nii et al. |
| 7,503,026 B2 | 3/2009 | Ichiryu et al. |
| 7,504,184 B2 | 3/2009 | Hung et al. |
| 7,506,300 B2 | 3/2009 | Sezginer et al. |
| 7,509,621 B2 | 3/2009 | Melvin, III |
| 7,509,622 B2 | 3/2009 | Sinha et al. |
| 7,512,017 B2 | 3/2009 | Chang |
| 7,512,921 B2 | 3/2009 | Shibuya |
| 7,514,959 B2 | 4/2009 | Or-Bach et al. |
| 7,523,429 B2 | 4/2009 | Kroyan et al. |
| 7,527,900 B2 | 5/2009 | Zhou et al. |
| 7,538,368 B2 | 5/2009 | Yano |
| 7,543,262 B2 | 6/2009 | Wang et al. |
| 7,563,701 B2 | 7/2009 | Chang et al. |
| 7,564,134 B2 | 7/2009 | Lee et al. |
| 7,568,174 B2 | 7/2009 | Sezginer et al. |
| 7,569,309 B2 | 8/2009 | Walter et al. |
| 7,569,310 B2 | 8/2009 | Wallace et al. |
| 7,569,894 B2 | 8/2009 | Suzuki |
| 7,575,973 B2 | 8/2009 | Mokhlesi et al. |
| 7,598,541 B2 | 10/2009 | Okamoto et al. |
| 7,598,558 B2 | 10/2009 | Hashimoto et al. |
| 7,614,030 B2 | 11/2009 | Hsu |
| 7,625,790 B2 | 12/2009 | Yang |
| 7,632,610 B2 | 12/2009 | Wallace et al. |
| 7,640,522 B2 | 12/2009 | Gupta et al. |
| 7,646,651 B2 | 1/2010 | Lee et al. |
| 7,653,884 B2 | 1/2010 | Furnish et al. |
| 7,665,051 B2 | 2/2010 | Ludwig et al. |
| 7,700,466 B2 | 4/2010 | Booth et al. |
| 7,712,056 B2 | 5/2010 | White et al. |
| 7,739,627 B2 | 6/2010 | Chew et al. |
| 7,749,662 B2 | 7/2010 | Matthew et al. |
| 7,755,110 B2 | 7/2010 | Gliese et al. |
| 7,770,144 B2 | 8/2010 | Dellinger |
| 7,791,109 B2 | 9/2010 | Wann et al. |
| 7,802,219 B2 | 9/2010 | Tomar et al. |
| 7,825,437 B2 | 11/2010 | Pillarisetty et al. |
| 7,842,975 B2 | 11/2010 | Becker et al. |
| 7,873,929 B2 | 1/2011 | Kahng et al. |
| 7,882,456 B2 | 2/2011 | Zach |
| 7,888,705 B2 | 2/2011 | Becker et al. |
| 7,898,040 B2 | 3/2011 | Nawaz |
| 7,906,801 B2 | 3/2011 | Becker et al. |
| 7,908,578 B2 | 3/2011 | Becker et al. |
| 7,910,958 B2 | 3/2011 | Becker et al. |
| 7,910,959 B2 | 3/2011 | Becker et al. |
| 7,917,877 B2 | 3/2011 | Singh et al. |
| 7,917,879 B2 | 3/2011 | Becker et al. |
| 7,923,266 B2 | 4/2011 | Thijs et al. |
| 7,923,337 B2 | 4/2011 | Chang et al. |
| 7,923,757 B2 | 4/2011 | Becker et al. |
| 7,932,544 B2 | 4/2011 | Becker et al. |
| 7,932,545 B2 | 4/2011 | Becker et al. |
| 7,934,184 B2 | 4/2011 | Zhang |
| 7,943,966 B2 | 5/2011 | Becker et al. |
| 7,943,967 B2 | 5/2011 | Becker et al. |
| 7,948,012 B2 | 5/2011 | Becker et al. |
| 7,948,013 B2 | 5/2011 | Becker et al. |
| 7,952,119 B2 | 5/2011 | Becker et al. |
| 7,956,421 B2 | 6/2011 | Becker |
| 7,958,465 B2 | 6/2011 | Lu et al. |
| 7,962,867 B2 | 6/2011 | White et al. |
| 7,962,879 B2 | 6/2011 | Tang et al. |
| 7,964,267 B1 | 6/2011 | Lyons et al. |
| 7,971,160 B2 | 6/2011 | Osawa et al. |
| 7,989,847 B2 | 8/2011 | Becker et al. |
| 7,989,848 B2 | 8/2011 | Becker et al. |
| 7,992,122 B1 | 8/2011 | Burstein et al. |
| 7,994,583 B2 | 8/2011 | Inaba |
| 8,004,042 B2 | 8/2011 | Yang et al. |
| 8,022,441 B2 | 9/2011 | Becker et al. |
| 8,030,689 B2 | 10/2011 | Becker et al. |
| 8,035,133 B2 | 10/2011 | Becker et al. |
| 8,044,437 B1 | 10/2011 | Venkatraman et al. |
| 8,058,671 B2 | 11/2011 | Becker et al. |
| 8,058,690 B2 | 11/2011 | Chang |
| 8,072,003 B2 | 12/2011 | Becker et al. |
| 8,072,053 B2 | 12/2011 | Li |
| 8,088,679 B2 | 1/2012 | Becker et al. |
| 8,088,680 B2 | 1/2012 | Becker et al. |
| 8,088,681 B2 | 1/2012 | Becker et al. |
| 8,088,682 B2 | 1/2012 | Becker et al. |
| 8,089,098 B2 | 1/2012 | Becker et al. |
| 8,089,099 B2 | 1/2012 | Becker et al. |
| 8,089,100 B2 | 1/2012 | Becker et al. |
| 8,089,101 B2 | 1/2012 | Becker et al. |
| 8,089,102 B2 | 1/2012 | Becker et al. |
| 8,089,103 B2 | 1/2012 | Becker et al. |
| 8,089,104 B2 | 1/2012 | Becker et al. |
| 8,101,975 B2 | 1/2012 | Becker et al. |
| 8,110,854 B2 | 2/2012 | Becker et al. |
| 8,129,750 B2 | 3/2012 | Becker et al. |

(56) References Cited

U.S. PATENT DOCUMENTS

| | | |
|---|---|---|
| 8,129,751 B2 | 3/2012 | Becker et al. |
| 8,129,752 B2 | 3/2012 | Becker et al. |
| 8,129,754 B2 | 3/2012 | Becker et al. |
| 8,129,755 B2 | 3/2012 | Becker et al. |
| 8,129,756 B2 | 3/2012 | Becker et al. |
| 8,129,757 B2 | 3/2012 | Becker et al. |
| 8,129,819 B2 | 3/2012 | Becker et al. |
| 8,130,529 B2 | 3/2012 | Tanaka |
| 8,134,183 B2 | 3/2012 | Becker et al. |
| 8,134,184 B2 | 3/2012 | Becker et al. |
| 8,134,185 B2 | 3/2012 | Becker et al. |
| 8,134,186 B2 | 3/2012 | Becker et al. |
| 8,138,525 B2 | 3/2012 | Becker et al. |
| 8,161,427 B2 | 4/2012 | Morgenshtein et al. |
| 8,178,905 B2 | 5/2012 | Toubou |
| 8,178,909 B2 | 5/2012 | Venkatraman et al. |
| 8,198,656 B2 | 6/2012 | Becker et al. |
| 8,207,053 B2 | 6/2012 | Becker et al. |
| 8,214,778 B2 | 7/2012 | Quandt et al. |
| 8,217,428 B2 | 7/2012 | Becker et al. |
| 8,225,239 B2 | 7/2012 | Reed et al. |
| 8,225,261 B2 | 7/2012 | Hong et al. |
| 8,245,180 B2 | 8/2012 | Smayling et al. |
| 8,247,846 B2 | 8/2012 | Becker |
| 8,253,172 B2 | 8/2012 | Becker et al. |
| 8,253,173 B2 | 8/2012 | Becker et al. |
| 8,258,547 B2 | 9/2012 | Becker et al. |
| 8,258,548 B2 | 9/2012 | Becker et al. |
| 8,258,549 B2 | 9/2012 | Becker et al. |
| 8,258,550 B2 | 9/2012 | Becker et al. |
| 8,258,551 B2 | 9/2012 | Becker et al. |
| 8,258,552 B2 | 9/2012 | Becker et al. |
| 8,264,007 B2 | 9/2012 | Becker et al. |
| 8,264,008 B2 | 9/2012 | Becker et al. |
| 8,264,009 B2 | 9/2012 | Becker et al. |
| 8,283,701 B2 | 10/2012 | Becker et al. |
| 8,316,327 B2 | 11/2012 | Herold |
| 8,356,268 B2 | 1/2013 | Becker et al. |
| 8,378,407 B2 | 2/2013 | Audzeyeu et al. |
| 8,402,397 B2 | 3/2013 | Robles et al. |
| 8,422,274 B2 | 4/2013 | Tomita et al. |
| 2002/0003270 A1 | 1/2002 | Makino |
| 2002/0015899 A1 | 2/2002 | Chen et al. |
| 2002/0030510 A1 | 3/2002 | Kono et al. |
| 2002/0079927 A1 | 6/2002 | Katoh et al. |
| 2002/0149392 A1 | 10/2002 | Cho |
| 2002/0166107 A1 | 11/2002 | Capodieci et al. |
| 2002/0194575 A1 | 12/2002 | Allen et al. |
| 2003/0042930 A1 | 3/2003 | Pileggi et al. |
| 2003/0046653 A1 | 3/2003 | Liu |
| 2003/0061592 A1 | 3/2003 | Agrawal et al. |
| 2003/0088839 A1 | 5/2003 | Watanabe |
| 2003/0088842 A1 | 5/2003 | Cirit |
| 2003/0106037 A1 | 6/2003 | Moniwa et al. |
| 2003/0117168 A1 | 6/2003 | Uneme et al. |
| 2003/0124847 A1 | 7/2003 | Houston et al. |
| 2003/0125917 A1 | 7/2003 | Rich et al. |
| 2003/0126569 A1 | 7/2003 | Rich et al. |
| 2003/0145288 A1 | 7/2003 | Wang et al. |
| 2003/0145299 A1 | 7/2003 | Fried et al. |
| 2003/0177465 A1 | 9/2003 | MacLean et al. |
| 2003/0185076 A1 | 10/2003 | Worley |
| 2003/0229868 A1 | 12/2003 | White et al. |
| 2003/0229875 A1 | 12/2003 | Smith et al. |
| 2004/0049754 A1 | 3/2004 | Liao et al. |
| 2004/0063038 A1 | 4/2004 | Shin et al. |
| 2004/0115539 A1 | 6/2004 | Broeke et al. |
| 2004/0139412 A1 | 7/2004 | Ito et al. |
| 2004/0145028 A1 | 7/2004 | Matsumoto et al. |
| 2004/0153979 A1 | 8/2004 | Chang |
| 2004/0161878 A1 | 8/2004 | Or-Bach et al. |
| 2004/0169201 A1 | 9/2004 | Hidaka |
| 2004/0194050 A1 | 9/2004 | Hwang et al. |
| 2004/0196705 A1 | 10/2004 | Ishikura et al. |
| 2004/0229135 A1 | 11/2004 | Wang et al. |
| 2004/0232444 A1 | 11/2004 | Shimizu |
| 2004/0243966 A1 | 12/2004 | Dellinger |
| 2004/0262640 A1 | 12/2004 | Suga |
| 2005/0009312 A1 | 1/2005 | Butt et al. |
| 2005/0009344 A1 | 1/2005 | Hwang et al. |
| 2005/0012157 A1 | 1/2005 | Cho et al. |
| 2005/0055828 A1 | 3/2005 | Wang et al. |
| 2005/0076320 A1 | 4/2005 | Maeda |
| 2005/0087806 A1 | 4/2005 | Hokazono |
| 2005/0093147 A1 | 5/2005 | Tu |
| 2005/0101112 A1 | 5/2005 | Rueckes et al. |
| 2005/0110130 A1 | 5/2005 | Kitabayashi et al. |
| 2005/0135134 A1 | 6/2005 | Yen et al. |
| 2005/0136340 A1 | 6/2005 | Baselmans et al. |
| 2005/0138598 A1 | 6/2005 | Kokubun |
| 2005/0156200 A1 | 7/2005 | Kinoshita |
| 2005/0185325 A1 | 8/2005 | Hur |
| 2005/0189604 A1 | 9/2005 | Gupta et al. |
| 2005/0189614 A1 | 9/2005 | Ihme et al. |
| 2005/0196685 A1 | 9/2005 | Wang et al. |
| 2005/0205894 A1 | 9/2005 | Sumikawa et al. |
| 2005/0212018 A1 | 9/2005 | Schoellkopf et al. |
| 2005/0224982 A1 | 10/2005 | Kemerling et al. |
| 2005/0229130 A1 | 10/2005 | Wu et al. |
| 2005/0251771 A1 | 11/2005 | Robles |
| 2005/0264320 A1 | 12/2005 | Chung et al. |
| 2005/0264324 A1 | 12/2005 | Nakazato et al. |
| 2005/0266621 A1 | 12/2005 | Kim |
| 2005/0268256 A1 | 12/2005 | Tsai et al. |
| 2005/0280031 A1 | 12/2005 | Yano |
| 2006/0038234 A1 | 2/2006 | Liaw |
| 2006/0063334 A1 | 3/2006 | Donze et al. |
| 2006/0070018 A1 | 3/2006 | Semmler |
| 2006/0084261 A1 | 4/2006 | Iwaki |
| 2006/0091550 A1 | 5/2006 | Shimazaki et al. |
| 2006/0095872 A1 | 5/2006 | McElvain |
| 2006/0101370 A1 | 5/2006 | Cui et al. |
| 2006/0112355 A1 | 5/2006 | Pileggi et al. |
| 2006/0113567 A1 | 6/2006 | Ohmori et al. |
| 2006/0120143 A1 | 6/2006 | Liaw |
| 2006/0121715 A1 | 6/2006 | Chang et al. |
| 2006/0123376 A1 | 6/2006 | Vogel et al. |
| 2006/0125024 A1 | 6/2006 | Ishigaki |
| 2006/0131609 A1 | 6/2006 | Kinoshita et al. |
| 2006/0136848 A1 | 6/2006 | Ichiryu et al. |
| 2006/0146638 A1 | 7/2006 | Chang et al. |
| 2006/0151810 A1 | 7/2006 | Ohshige |
| 2006/0158270 A1 | 7/2006 | Gibet et al. |
| 2006/0177744 A1 | 8/2006 | Bodendorf et al. |
| 2006/0181310 A1 | 8/2006 | Rhee |
| 2006/0195809 A1 | 8/2006 | Cohn et al. |
| 2006/0197557 A1 | 9/2006 | Chung |
| 2006/0206854 A1 | 9/2006 | Barnes et al. |
| 2006/0223302 A1 | 10/2006 | Chang et al. |
| 2006/0248495 A1 | 11/2006 | Sezginer |
| 2007/0001304 A1 | 1/2007 | Liaw |
| 2007/0002617 A1 | 1/2007 | Houston |
| 2007/0007574 A1 | 1/2007 | Ohsawa |
| 2007/0038973 A1 | 2/2007 | Li et al. |
| 2007/0074145 A1 | 3/2007 | Tanaka |
| 2007/0094634 A1 | 4/2007 | Seizginer et al. |
| 2007/0101305 A1 | 5/2007 | Smith et al. |
| 2007/0105023 A1 | 5/2007 | Zhou et al. |
| 2007/0106971 A1 | 5/2007 | Lien et al. |
| 2007/0113216 A1 | 5/2007 | Zhang |
| 2007/0172770 A1 | 7/2007 | Witters et al. |
| 2007/0196958 A1 | 8/2007 | Bhattacharya et al. |
| 2007/0209029 A1 | 9/2007 | Ivonin et al. |
| 2007/0210391 A1 | 9/2007 | Becker et al. |
| 2007/0234252 A1 | 10/2007 | Visweswariah et al. |
| 2007/0256039 A1 | 11/2007 | White |
| 2007/0257277 A1 | 11/2007 | Takeda et al. |
| 2007/0274140 A1 | 11/2007 | Joshi et al. |
| 2007/0277129 A1 | 11/2007 | Allen et al. |
| 2007/0288882 A1 | 12/2007 | Kniffin et al. |
| 2007/0290361 A1 | 12/2007 | Chen |
| 2007/0294652 A1 | 12/2007 | Bowen |
| 2007/0297249 A1 | 12/2007 | Chang et al. |
| 2008/0005712 A1 | 1/2008 | Charlebois et al. |

(56) References Cited

U.S. PATENT DOCUMENTS

| | | |
|---|---|---|
| 2008/0046846 A1 | 2/2008 | Chew et al. |
| 2008/0082952 A1 | 4/2008 | O'Brien |
| 2008/0086712 A1 | 4/2008 | Fujimoto |
| 2008/0097641 A1 | 4/2008 | Miyashita et al. |
| 2008/0098334 A1 | 4/2008 | Pileggi et al. |
| 2008/0099795 A1 | 5/2008 | Bernstein et al. |
| 2008/0127000 A1 | 5/2008 | Majumder et al. |
| 2008/0127029 A1 | 5/2008 | Graur et al. |
| 2008/0134128 A1 | 6/2008 | Blatchford et al. |
| 2008/0144361 A1 | 6/2008 | Wong |
| 2008/0148216 A1 | 6/2008 | Chan et al. |
| 2008/0163141 A1 | 7/2008 | Scheffer et al. |
| 2008/0168406 A1 | 7/2008 | Rahmat et al. |
| 2008/0211028 A1 | 9/2008 | Suzuki |
| 2008/0216207 A1 | 9/2008 | Tsai |
| 2008/0244494 A1 | 10/2008 | McCullen |
| 2008/0251779 A1 | 10/2008 | Kakoschke et al. |
| 2008/0265290 A1 | 10/2008 | Nielsen et al. |
| 2008/0276105 A1 | 11/2008 | Hoberman et al. |
| 2008/0283910 A1 | 11/2008 | Dreeskornfeld et al. |
| 2008/0285331 A1 | 11/2008 | Torok et al. |
| 2008/0308848 A1 | 12/2008 | Inaba |
| 2008/0315258 A1 | 12/2008 | Masuda et al. |
| 2009/0014811 A1 | 1/2009 | Becker et al. |
| 2009/0024974 A1 | 1/2009 | Yamada |
| 2009/0031261 A1 | 1/2009 | Smith et al. |
| 2009/0032898 A1 | 2/2009 | Becker et al. |
| 2009/0032967 A1 | 2/2009 | Becker et al. |
| 2009/0037864 A1 | 2/2009 | Becker et al. |
| 2009/0057780 A1 | 3/2009 | Wong et al. |
| 2009/0075485 A1 | 3/2009 | Ban et al. |
| 2009/0077524 A1 | 3/2009 | Nagamura et al. |
| 2009/0085067 A1 | 4/2009 | Hayashi et al. |
| 2009/0087991 A1 | 4/2009 | Yatsuda et al. |
| 2009/0101940 A1 | 4/2009 | Barrows et al. |
| 2009/0106714 A1 | 4/2009 | Culp et al. |
| 2009/0155990 A1 | 6/2009 | Yanagidaira et al. |
| 2009/0181314 A1 | 7/2009 | Shyu et al. |
| 2009/0187871 A1 | 7/2009 | Cork |
| 2009/0206443 A1 | 8/2009 | Juengling |
| 2009/0224408 A1 | 9/2009 | Fox |
| 2009/0228853 A1 | 9/2009 | Hong et al. |
| 2009/0228857 A1 | 9/2009 | Kornachuk et al. |
| 2009/0273100 A1 | 11/2009 | Aton et al. |
| 2009/0280582 A1 | 11/2009 | Thijs et al. |
| 2009/0302372 A1 | 12/2009 | Chang et al. |
| 2009/0319977 A1 | 12/2009 | Saxena et al. |
| 2010/0001321 A1 | 1/2010 | Becker et al. |
| 2010/0006897 A1 | 1/2010 | Becker et al. |
| 2010/0006898 A1 | 1/2010 | Becker et al. |
| 2010/0006899 A1 | 1/2010 | Becker et al. |
| 2010/0006900 A1 | 1/2010 | Becker et al. |
| 2010/0006901 A1 | 1/2010 | Becker et al. |
| 2010/0006902 A1 | 1/2010 | Becker et al. |
| 2010/0006903 A1 | 1/2010 | Becker et al. |
| 2010/0006947 A1 | 1/2010 | Becker et al. |
| 2010/0006948 A1 | 1/2010 | Becker et al. |
| 2010/0006950 A1 | 1/2010 | Becker et al. |
| 2010/0006951 A1 | 1/2010 | Becker et al. |
| 2010/0006986 A1 | 1/2010 | Becker et al. |
| 2010/0011327 A1 | 1/2010 | Becker et al. |
| 2010/0011328 A1 | 1/2010 | Becker et al. |
| 2010/0011329 A1 | 1/2010 | Becker et al. |
| 2010/0011330 A1 | 1/2010 | Becker et al. |
| 2010/0011331 A1 | 1/2010 | Becker et al. |
| 2010/0011332 A1 | 1/2010 | Becker et al. |
| 2010/0011333 A1 | 1/2010 | Becker et al. |
| 2010/0012981 A1 | 1/2010 | Becker et al. |
| 2010/0012982 A1 | 1/2010 | Becker et al. |
| 2010/0012983 A1 | 1/2010 | Becker et al. |
| 2010/0012984 A1 | 1/2010 | Becker et al. |
| 2010/0012985 A1 | 1/2010 | Becker et al. |
| 2010/0012986 A1 | 1/2010 | Becker et al. |
| 2010/0017766 A1 | 1/2010 | Becker et al. |
| 2010/0017767 A1 | 1/2010 | Becker et al. |
| 2010/0017768 A1 | 1/2010 | Becker et al. |
| 2010/0017769 A1 | 1/2010 | Becker et al. |
| 2010/0017770 A1 | 1/2010 | Becker et al. |
| 2010/0017771 A1 | 1/2010 | Becker et al. |
| 2010/0017772 A1 | 1/2010 | Becker et al. |
| 2010/0019280 A1 | 1/2010 | Becker et al. |
| 2010/0019281 A1 | 1/2010 | Becker et al. |
| 2010/0019282 A1 | 1/2010 | Becker et al. |
| 2010/0019283 A1 | 1/2010 | Becker et al. |
| 2010/0019284 A1 | 1/2010 | Becker et al. |
| 2010/0019285 A1 | 1/2010 | Becker et al. |
| 2010/0019286 A1 | 1/2010 | Becker et al. |
| 2010/0019287 A1 | 1/2010 | Becker et al. |
| 2010/0019288 A1 | 1/2010 | Becker et al. |
| 2010/0019308 A1 | 1/2010 | Chan et al. |
| 2010/0023906 A1 | 1/2010 | Becker et al. |
| 2010/0023907 A1 | 1/2010 | Becker et al. |
| 2010/0023908 A1 | 1/2010 | Becker et al. |
| 2010/0023911 A1 | 1/2010 | Becker et al. |
| 2010/0025731 A1 | 2/2010 | Becker et al. |
| 2010/0025732 A1 | 2/2010 | Becker et al. |
| 2010/0025733 A1 | 2/2010 | Becker et al. |
| 2010/0025734 A1 | 2/2010 | Becker et al. |
| 2010/0025735 A1 | 2/2010 | Becker et al. |
| 2010/0025736 A1 | 2/2010 | Becker et al. |
| 2010/0032722 A1 | 2/2010 | Becker et al. |
| 2010/0032723 A1 | 2/2010 | Becker et al. |
| 2010/0032724 A1 | 2/2010 | Becker et al. |
| 2010/0032726 A1 | 2/2010 | Becker et al. |
| 2010/0037194 A1 | 2/2010 | Becker et al. |
| 2010/0037195 A1 | 2/2010 | Becker et al. |
| 2010/0096671 A1 | 4/2010 | Becker et al. |
| 2010/0203689 A1 | 8/2010 | Bernstein et al. |
| 2010/0224943 A1 | 9/2010 | Kawasaki |
| 2010/0229140 A1 | 9/2010 | Werner et al. |
| 2010/0232212 A1 | 9/2010 | Anderson et al. |
| 2010/0264468 A1 | 10/2010 | Xu |
| 2010/0270681 A1 | 10/2010 | Bird et al. |
| 2010/0287518 A1 | 11/2010 | Becker |
| 2011/0016909 A1 | 1/2011 | Mirza et al. |
| 2011/0108890 A1 | 5/2011 | Becker et al. |
| 2011/0108891 A1 | 5/2011 | Becker et al. |
| 2011/0154281 A1 | 6/2011 | Zach |
| 2011/0207298 A1 | 8/2011 | Anderson et al. |
| 2011/0260253 A1 | 10/2011 | Inaba |
| 2011/0298025 A1 | 12/2011 | Haensch et al. |
| 2012/0012932 A1 | 1/2012 | Perng et al. |
| 2012/0273841 A1 | 11/2012 | Quandt et al. |
| 2013/0097574 A1 | 4/2013 | Balabanov et al. |

FOREIGN PATENT DOCUMENTS

| | | |
|---|---|---|
| EP | 1394858 | 3/2004 |
| EP | 1670062 | 6/2006 |
| EP | 1833091 | 8/2007 |
| EP | 1730777 | 9/2007 |
| EP | 2251901 | 11/2010 |
| FR | 2860920 | 4/2005 |
| JP | 58-182242 | 10/1983 |
| JP | 61-182244 | 8/1986 |
| JP | S63-310136 A | 12/1988 |
| JP | H07-153927 A | 6/1995 |
| JP | 2684980 | 7/1995 |
| JP | 1995-302706 | 11/1995 |
| JP | 1997-09289251 A | 11/1997 |
| JP | 10-116911 | 5/1998 |
| JP | 1999-045948 | 2/1999 |
| JP | 2001-068558 | 3/2001 |
| JP | 2002-026125 | 1/2002 |
| JP | 2002-026296 A | 1/2002 |
| JP | 2002-184870 A | 6/2002 |
| JP | 2001-056463 | 9/2002 |
| JP | 2002-258463 | 9/2002 |
| JP | 2002-289703 | 10/2002 |
| JP | 2001-272228 | 3/2003 |
| JP | 2003-264231 | 9/2003 |
| JP | 2004-013920 | 1/2004 |
| JP | 2004-200300 | 7/2004 |
| JP | 2004-241529 | 8/2004 |

(56) References Cited

FOREIGN PATENT DOCUMENTS

| | | |
|---|---|---|
| JP | 2004-342757 A | 12/2004 |
| JP | 2005-020008 | 1/2005 |
| JP | 2003-359375 | 5/2005 |
| JP | 2005-135971 A | 5/2005 |
| JP | 2005-149265 | 6/2005 |
| JP | 2005-183793 | 7/2005 |
| JP | 2005-203447 | 7/2005 |
| JP | 2005-114752 | 10/2006 |
| JP | 2006-303022 A | 11/2006 |
| KR | 10-0417093 | 6/1997 |
| KR | 10-1998-087485 | 12/1998 |
| KR | 1998-0084215 A | 12/1998 |
| KR | 10-1999-0057943 A | 7/1999 |
| KR | 10-2000-0028830 A | 5/2000 |
| KR | 10-2002-0034313 | 5/2002 |
| KR | 10-2002-0070777 | 9/2002 |
| KR | 2003-0022006 | 3/2003 |
| KR | 10-2005-0030347 A | 3/2005 |
| KR | 2005-0037965 A | 4/2005 |
| KR | 2006-0108233 A | 10/2006 |
| TW | 386288 | 4/2000 |
| WO | WO 2005/104356 | 11/2005 |
| WO | WO 2006/014849 | 2/2006 |
| WO | WO 2006/052738 | 5/2006 |
| WO | WO 2007/014053 | 2/2007 |
| WO | WO 2007/103587 | 9/2007 |

OTHER PUBLICATIONS

Acar, et al., "A Linear-Centric Simulation Framework for Parametric Fluctuations", 2002, IEEE, Carnegie Mellon University USA, pp. 1-8.
Amazawa, et al., "Fully Planarized Four-Level Interconnection with Stacked VLAS Using CMP of Selective CVD-A1 and Insulator and its Application to Quarter Micron Gate Array LSIs", 1995, IEEE, Japan, pp. 473-476.
Axelrad et al. "Efficient Full-Chip Yield Analysis Methodology for OPC-Corrected VLSI Design", 2000, International Symposium on Quality Electronic Design (ISQED).
Balasinski et al. "Impact of Subwavelength CD Tolerance on Device Performance", 2002, SPIE.
Burkhardt, et al., "Dark Field Double Dipole Lithography (DDL) for Back-End-Of-Line Processes", 2007, SPIE Proceeding Series, vol. 6520; 65200K.
Capetti, et al., "Sub kl=0.25 Lithography with Double Patterning Technique for 45nm Technology Node Flash Memory Devices at λ=193nm", 2007, SPIE Proceeding Series, vol. 6520; 65202K.
Capodieci, L., et al., "Toward a Methodology for Manufacturability-Driven Design Rule Exploration," DAC 2004, Jun. 7-11, 2004, San Diego, CA.
Chandra, et al., "An Interconnect Channel Design Methodology for High Performance Integrated Circuits", 2004, IEEE, Carnegie Mellon University, pp. 1-6.
Cheng, et al., "Feasibility Study of Splitting Pitch Technology on 45nm Contact Patterning with 0.93 NA", 2007, SPIE Proceeding Series, vol. 6520; 65202N.
Chow, et al., "The Design of a SRAM-Based Field-Programmable Gate Array—Part II: Circuit Design and Layout", 1999, IEEE, vol. 7 #3 pp. 321-330.
Clark et al. "Managing Standby and Active Mode Leakage Power in Deep Sub-Micron Design", Aug. 9-11, 2004, ACM.
Cobb et al. "Using OPC to Optimize for Image Slope and Improve Process Window", 2003, SPIE.
Devgan "Leakage Issues in IC Design: Part 3", 2003, CCAD.
DeVor, et al., "Statistical Quality Design and Control", 1992, Macmillan Publishing Company, pp. 264-267.
Dusa, et al. "Pitch Doubling Through Dual Patterning Lithography Challenges in Integration and Litho Budgets", 2007, SPIE Proceeding Series, vol. 6520; 65200G.
El-Gamal, "Fast, Cheap and Under Control: The Next Implementation Fabric", Jun. 2-6, 2003, ACM Press, pp. 354-355.
Firedberg, et al., "Modeling Within-Field Gate Length Spatial Variation for Process-Design Co-Optimization," 2005 Proc. of SPIE vol. 5756, pp. 178-188.
Frankel, "Quantum State Control Interference Lithography and Trim Double Patterning for 32-16nm Lithography", 2007, SPIE Proceeding Series, vol. 6520; 65202L.
Garg, et al. "Lithography Driven Layout Design", 2005, IEEE.
Grobman et al. "Reticle Enhancement Technology Trends: Resource and Manufacturability Implications for the Implementation of Physical Designs" Apr. 1-4, 2001, ACM.
Grobman et al. "Reticle Enhancement Technology: Implications and Challenges for Physical Design" Jun. 18-22, 2001, ACM.
Gupta et al. "Enhanced Resist and Etch CD Control by Design Perturbation", Oct. 4-7, 2006, Society of Photo-Optical Instrumentation Engineers.
Gupta et al. "A Practical Transistor-Level Dual Threshold Voltage Assignment Methodology", 2005, Sixth International Symposium on Quality Electronic Design (ISQED).
Gupta et al. "Detailed Placement for Improved Depth of Focus and CD Control", 2005, ACM.
Gupta et al. "Joining the Design and Mask Flows for Better and Cheaper Masks", Oct. 14-17, 2004, Society of Photo-Optical Instrumentation Engineers.
Gupta et al. "Manufacturing-Aware Physical Design", 2003, ACM.
Gupta et al. "Selective Gate-Length Biasing for Cost-Effective Runtime Leakage Control", Jun. 7-11, 2004, ACM.
Gupta et al. "Wafer Topography-Aware Optical Proximity Correction for Better DOF Margin and CD Control", Apr. 13-15, 2005, SPIE.
Gupta, Puneet, et al., "Manufacturing-aware Design Methodology for Assist Feature Correctness," 2005.
Ha et al., "Reduction in the Mask Error Factor by Optimizing the Diffraction Order of a Scattering Bar in Lithography," Journal of the Korean Physical Society, vol. 46, No. 5, May 2005, pp. 1213-1217.
Hakko, et al., "Extension of the 2D-TCC Technique to Optimize Mask Pattern Layouts," 2008 Proc. of SPIE vol. 7028, 11 pages.
Halpin et al., "Detailed Placement with Net Length Constraints," Publication Year 2003, Proceedings of the 3rd IEEE International Workshop on System-on-Chip for Real-Time Applications, pp. 22-27.
Hayashida, et al., "Manufacturable Local Interconnect technology Fully Compatible with Titanium Salicide Process", Jun. 11-12, 1991, VMIC Conference.
Heng, et al., "A VLSI Artwork Legalization Technique Base on a New Criterion of Minimum Layout Perturbation", 1997, ACM Press, pp. 116-121.
Heng, et al., "Toward Through-Process Layout Quality Metrics", Mar. 3-4, 2005, Society of Photo-Optical Instrumentation Engineers.
Hu, et al., "Synthesis and Placement Flow for Gain-Based Programmable Regular Fabrics", Apr. 6-9, 2003, ACM Press, pp. 197-203.
Hur et al., "Mongrel: Hybrid Techniques for Standard Cell Placement," Publication Year 2000, IEEE/ACM International Conference on Computer Aided Design, ICCAD-2000, pp. 165-170.
Hutton, et al., "A Methodology for FPGA to Structured-ASIC Synthesis and Verification", 2006, EDAA, pp. 64-69.
INTEL Core Microarchitecture White Paper "Introducing the 45 nm Next-Generation Intel Core Microarchitecture," 2007, Intel Corporation.
Jayakumar, et al., "A Metal and VIA Maskset Programmable VLSI Design Methodology using PLAs", 2004, IEEE, pp. 590-594.
Jhaveri, T. et al., Maximization of Layout Printability/Manufacturability by Extreme Layout Regularity, Proc. of the SPIE, Apr. 2006.
Kang, S.M., Metal-Metal Matrix (M3) for High-Speed MOS VLSI Layout, IEEE Trans. on CAD, vol. CAD-6, No. 5, Sep. 1987.
Kawashima, et al., "Mask Optimization for Arbitrary Patterns with 2D-TCC Resolution Enhancement Technique," 2008 Proc. of SPIE vol. 6924, 12 pages.
Kheterpal, et al., "Design Methodology for IC Manufacturability Based on Regular Logic-Bricks", DAC, Jun. 13-17, 2005, IEEE/AMC, vol. 6520.
Kheterpal, et al., "Routing Architecture Exploration for Regular Fabrics", DAC, Jun. 7-11, 2004, ACM Press, pp. 204-207.
Kim, et al., "Double Exposure Using 193nm Negative Tone Photoresist", 2007, SPIE Proceeding Series, vol. 6520; 65202M.

(56) References Cited

OTHER PUBLICATIONS

Kim, et al., "Issues and Challenges of Double Patterning Lithography in DRAM", 2007, SPIE Proceeding Series, vol. 6520; 65200H.
Koorapaty, et al., "Exploring Logic Block Granularity for Regular Fabrics", 2004, IEEE, pp. 1-6.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2002, Springer-Verlag, vol. 2438 pp. 132-141.
Kuh et al., "Recent Advances in VLSI Layout," Publication Year 1990, Proceedings of the IEEE, vol. 78, Issue 2, pp. 237-263.
Lavin et al. "Backend DAC Flows for "Restrictive Design Rules"", 2004, IEEE.
Li, et al., "A Linear-Centric Modeling Approach to Harmonic Balance Analysis", 2002, IEEE, pp. 1-6.
Li, et al., "Nonlinear Distortion Analysis Via Linear-Centric Models", 2003, IEEE, pp. 897-903.
Liebmann et al., "Integrating DfM Components into a Cohesive Design-to-Silicon Solution," Proc. SPIE 5756, Design and Process Integration for Microelectronic Manufacturing III, 1 (May 13, 2005).
Liebmann et al., "Optimizing Style Options for Sub-Resolution Assist Features," Proc. of SPIE vol. 4346, 2001, pp. 141-152.
Liebmann, et al., "High-Performance Circuit Design for the RET-Enabled 65nm Technology Node", Feb. 26-27, 2004, SPIE Proceeding Series, vol. 5379 pp. 20-29.
Liebmann, L. W., Layout Impact of Resolution Enhancement Techniques: Impediment or Opportunity?, International Symposium on Physical Design, 2003.
Liu et al., "Double Patterning with Multilayer Hard Mask Shrinkage for Sub 0.25 k1 Lithography," Proc. SPIE 6520, Optical Microlithography XX, 65202J (Mar. 27, 2007).
Mansfield et al., "Lithographic Comparison of Assist Feature Design Strategies," Proc. of SPIE vol. 4000, 2000, pp. 63-76.
Miller, "Manufacturing-Aware Design Helps Boost IC Yield", Sep. 9, 2004, http://www.eetimes.com/showArticle.jhtml?articleID=47102054.
Mishra, P., et al., "FinFET Circuit Design," Nanoelectronic Circuit Design, pp. 23-54, 2011.
Mo, et al., "Checkerboard: A Regular Structure and its Synthesis, International Workshop on Logic and Synthesis", 2003, Department of Electrical Engineering and Computer Sciences, UC Berkeley, California, pp. 1-7.
Mo, et al., "PLA-Based Regular Structures and Their Synthesis", 2003, Department of Electrical Engineering and Computer Sciences, IEEE, pp. 723-729.
Mo, et al., "Regular Fabrics in Deep Sub-Micron Integrated-Circuit Design", 2004, Kluwer Academic Publishers, Entire Book.
Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.
Mutoh et al. "1-V Power Supply High-Speed Digital Circuit Technology with Multithreshold-Voltage CMOS", 1995, IEEE.
Op de Beek, et al., "Manufacturability issues with Double Patterning for 50nm half pitch damascene applications, using RELACS® shrink and corresponding OPC", 2007, SPIE Proceeding Series, vol. 6520; 65200I.
Or-Bach, "Programmable Circuit Fabrics", Sep. 18, 2001, e-ASIC, pp. 1-36.
Otten, et al., "Planning for Performance", DAC 1998, ACM Inc., pp. 122-127.
Pack et al. "Physical & Timing Verification of Subwavelength-Scale Designs-Part I: Lithography Impact on MOSFETs", 2003, SPIE.
Pandini, et al., "Congestion-Aware Logic Synthesis", 2002, IEEE, pp. 1-8.
Pandini, et al., "Understanding and Addressing the Impact of Wiring Congestion During Technology Mapping", ISPD Apr. 7-10, 2002, ACM Press, pp. 131-136.
Patel, et al., "An Architectural Exploration of Via Patterned Gate Arrays, ISPD 2003", Apr. 6, 2003, pp. 184-189.
Pham, D., et al., "FINFET Device Junction Formation Challenges," 2006 International Workshop on Junction Technology, pp. 73-77, Aug. 2006.
Pileggi, et al., "Exploring Regular Fabrics to Optimize the Performance-Cost Trade-Offs, Proceedings of the 40th ACM/IEEE Design Automation Conference (DAC) 2003", Jun. 2003, ACM Press, pp. 782-787.
Poonawala, et al., "ILT for Double Exposure Lithography with Conventional and Novel Materials", 2007, SPIE Proceeding Series, vol. 6520; 65202Q.
Qian et al. "Advanced Physical Models for Mask Data Verification and Impacts on Physical Layout Synthesis" 2003. IEEE.
Ran, et al., "An Integrated Design Flow for a Via-Configurable Gate Array", 2004, IEEE, pp. 582-589.
Ran, et al., "Designing a Via-Configurable Regular Fabric", Custom Integrated Circuits Conference (CICC). Proceedings of the IEEE, Oct. 2004, Oct. 1, 2004, pp. 423-426.
Ran, et al., "On Designing Via-Configurable Cell Blocks for Regular Fabrics" Proceedings of the Design Automation Conference (DAC) 2004, Jun. 2004, ACM Press, s 198-203.
Ran, et al., "The Magic of a Via-Configurable Regular Fabric", Proceedings of the IEEE International Conference on Computer Design (ICCD) Oct. 2004.
Ran, et al., "Via-Configurable Routing Architectures and Fast Design Mappability Estimation for Regular Fabrics", 2005, IEEE, pp. 25-32.
Reis, et al., "Physical Design Methodologies for Performance Predictability and Manufacturability", Apr. 14-16, 2004, ACM Press, pp. 390-397.
Robertson, et al., "The Modeling of Double Patterning Lithographic Processes", 2007, SPIE Proceeding Series, vol. 6520; 65200J.
Rosenbluth, et al., "Optimum Mask and Source Patterns to Print a Given Shape," 2001 Proc. of SPIE vol. 4346, pp. 486-502.
Rovner, "Design for Manufacturability in Via Programmable Gate Arrays", May 2003, Graduate School of Carnegie Mellon University.
Sengupta, "An Integrated CAD Framework Linking VLSI Layout Editors and Process Simulators", 1998, Thesis for Rice University, pp. 1-101.
Sengupta, et al., "An Integrated CAD Framework Linking VLSI Layout Editors and Process Simulators", 1996, SPIE Proceeding Series, vol. 2726; pp. 244-252.
Sherlekar, "Design Considerations for Regular Fabrics", Apr. 18-21, 2004, ACM Press, pp. 97-102.
Shi et al., "Understanding the Forbidden Pitch and Assist Feature Placement," Proc. of SPIE vol. 4562, 2002, pp. 968-979.
Smayling et al., "APF Pitch Halving for 22 nm Logic Cells Using Gridded Design Rules," Proceedings of SPIE, USA, vol. 6925, Jan. 1, 2008, pp. 69251E-1-69251E-7.
Socha, et al., "Simultaneous Source Mask Optimization (SMO)," 2005 Proc. of SPIE vol. 5853, pp. 180-193.
Sreedhar et al. "Statistical Yield Modeling for Sub-Wavelength Lithography", 2008, IEEE.
Stapper, "Modeling of Defects in Integrated Circuit Photolithographic Patterns", Jul. 1, 1984, IBM, vol. 28 # 4, pp. 461-475.
Taylor, et al., "Enabling Energy Efficiency in Via-Patterned Gate Array Devices", Jun. 7-11, 2004, ACM Press, pp. 874-877.
Tian et al. "Model-Based Dummy Feature Placement for Oxide Chemical_Mechanical Polishing Manufacturability" 2000, ACM.
Tong, et al., "Regular Logic Fabrics for a Via Patterned Gate Array (VPGA), Custom Integrated Circuits Conference", Sep. 2003, Proceedings of the IEEE, pp. 53-56.
Vanleenhove, et al., "A Litho-Only Approach to Double Patterning", 2007, SPIE Proceeding Series, vol. 6520; 65202F.
Wang, et al., "Performance Optimization for Gridded-Layout Standard Cells", 2004, vol. 5567 SPIE.
Wang, J. et al., Standard Cell Layout with Regular Contact Placement, IEEE Trans. on Semicon. Mfg., vol. 17, No. 3, Aug. 2004.

(56) References Cited

OTHER PUBLICATIONS

Webb, Clair, "45nm Design for Manufacturing," Intel Technology Journal, vol. 12, Issue 02, Jun. 17, 2008, ISSN 1535-864X, pp. 121-130.
Webb, Clair, "Layout Rule Trends and Affect upon CPU Design", 2006, vol. 6156 SPIE.
Wenren, et al., "The Improvement of Photolithographic Fidelity of Two-dimensional Structures Though Double Exposure Method", 2007, SPIE Proceeding Series, vol. 6520; 65202I.
Wilcox, et al., "Design for Manufacturability: A Key to Semiconductor Manufacturing Excellence", 1998, IEEE, pp. 308-313.
Wong, et al., "Resolution Enhancement Techniques and Design for Manufacturability: Containing and Accounting for Variabilities in Integrated Circuit Creation," J. Micro/Nanolith. MEMS MOEMS, Jul.-Sep. 2007, vol. 6(3), 2 pages.
Wu, et al., "A Study of Process Window Capabilities for Two-dimensional Structures under Double Exposure Condition", 2007, SPIE Proceeding Series, vol. 6520; 65202O.
Xiong, et al., "The Constrained Via Minimization Problem for PCB and VLSI Design", 1988, ACM Press/IEEE, pp. 573-578.
Yamamaoto, et al., "New Double Exposure Technique without Alternating Phase Shift Mask", 2007, SPIE Proceeding Series, vol. 6520; 652052P.
Yamazoe, et al., "Resolution Enhancement by Aerial Image Approximation with 2D-TCC," 2007 Proc. of SPIE vol. 6730, 12 pages.
Yang, et al., "Interconnection Driven VLSI Module Placement Based on Quadratic Programming and Considering Congestion Using LFF Principles", 2004, IEEE, pp. 1243-1247.
Yao, et al., "Multilevel Routing With Redundant Via Insertion", Oct. 2006, IEEE, pp. 1148-1152.
Yu, et al., "True Process Variation Aware Optical Proximity Correction with Variational Lithography Modeling and Model Calibration," J. Micro/Nanolith. MEMS MOEMS, Jul.-Sep. 2007, vol. 6(3), 16 pages.
Zheng, et al."Modeling and Analysis of Regular Symmetrically Structured Power/Ground Distribution Networks", DAC, Jun. 10-14, 2002, ACM Press, pp. 395-398.
Zhu, et al., "A Stochastic Integral Equation Method for Modeling the Rough Surface Effect on Interconnect Capacitance", 2004, IEEE.
Zhu, et al., "A Study of Double Exposure Process Design with Balanced Performance Parameters for Line/Space Applications", 2007, SPIE Proceeding Series, vol. 6520; 65202H.
Zuchowskj, et al., "A Hybrid ASIC and FPGA Architecture", 2003, IEEE, pp. 187-194.
Alam, Syed M. et al., "A Comprehensive Layout Methodology and Layout-Specific Circuit Analyses for Three-Dimensional Integrated Circuits," Mar. 21, 2002.
Alam, Syed M. et al., "Layout-Specific Circuit Evaluation in 3-D Integrated Circuits," May 2003.
Aubusson, Russel, "Wafer-Scale Integration of Semiconductor Memory," Apr. 1979.
Bachtold, "Logic Circuits with Carbon," Nov. 9, 2001.
Baker, R. Jacob, "CMOS: Circuit Design, Layout, and Simulation (2nd Edition)," Nov. 1, 2004.
Baldi et al., "A Scalable Single Poly EEPROM Cell for Embedded Memory Applications," pp. 1-4, Fig. 1, Sep. 1997.
Cao, Ke, "Design for Manufacturing (DFM) in Submicron VLSI Design," Aug. 2007.
Capodieci, Luigi, "From Optical Proximity Correction to Lithography-Driven Physical Design (1996-2006): 10 years of Resolution Enhancement Technology and the roadmap enablers for the next decade," Proc. SPIE 6154, Optical Microlithography XIX, 615401, Mar. 20, 2006.
Chang, Leland et al., "Stable SRAM Cell Design for the 32 nm Node and Beyond," Jun. 16, 2005.
Cheung, Peter, "Layout Design," Apr. 4, 2004.
Chinnery, David, "Closing the Gap Between ASIC & Custom: Tools and Techniques for High-Performance ASIC Design," Jun. 30, 2002.
Chou, Dyiann et al., "Line End Optimization through Optical Proximity Correction (OPC): A Case Study," Feb. 19, 2006.
Clein, Dan, "CMOS IC Layout: Concepts, Methodologies, and Tools," Dec. 22, 1999.
Cowell, "Exploiting Non-Uniform Access Time," Jul. 2003.
Das, Shamik, "Design Automation and Analysis of Three-Dimensional Integrated Circuits," May 1, 2004.
Dehaene, W. et al., "Technology-Aware Design of SRAM Memory Circuits," Mar. 2007.
Deng, Liang et al., "Coupling-aware Dummy Metal Insertion for Lithography," p. 1, col. 2, 2007.
Devoivre et al., "Validated 90nm CMOS Technology Platform with Low-k Copper Interconnects for Advanced System-on-Chip (SoC)," 2002.
Enbody, R. J., "Near-Optimal n-Layer Channel Routing," 1986.
Ferretti, Marcos et al., "High Perfoltnance Asynchronous ASIC Back-End Design Flow Using Single-Track Full-Buffer Standard Cells," Apr. 23, 2004.
Garg, Manish et al., "Litho-driven Layouts for Reducing Performance Variability," p. 2, Figs. 2b-2c, May 23, 2005.
Greenway, Robert et al., "32nm 1-D Regular Pitch SRAM Bitcell Design for Interference-Assisted Lithography," 2008.
Gupta et al., "Modeling Edge Placement Error Distribution in Standard Cell Library," Feb. 23-24, 2006.
Grad, Johannes et al., "A standard cell library for student projects," Proceedings of the 2003 IEEE International Conference on Microelectronic Systems Education, Jun. 2, 2003.
Hartono, Roy et al., "Active Device Generation for Automatic Analog Layout Retargeting Tool," May 13, 2004.
Hartono, Roy et al., "IPRAIL—Intellectual Property Reuse-based Analog IC Layout Automation," Mar. 17, 2003.
Hastings, Alan, "The Art of Analog Layout (2nd Edition)," Jul. 4, 2005.
Hurata et al., "A Genuine Design Manufacturability Check for Designers," 2006.
Institute of Microelectronic Systems, "Digital Subsystem Design," Oct. 13, 2006.
Ishida, M. et al., "A Novel 6T-SRAM Cell Technology Designed with Rectangular Patterns Scalable beyond 0.18 pm Generation and Desirable for Ultra High Speed Operation," 1998.
Jakusovszky, "Linear IC Parasitic Element Simulation Methodology," Oct. 1, 1993.
Jangkrajarng, Nuttorn et al., "Template-Based Parasitic-Aware Optimization and Retargeting of Analog and RF Integrated Circuit Layouts," Nov. 5, 2006.
Kahng, Andrew B., "Design Optimizations DAC-2006 DFM Tutorial, part V)," 2006.
Kang, Sung-Mo et al., "CMOS Digital Integrated Circuits Analysis & Design," Oct. 29, 2002.
Kottoor, Mathew Francis, "Development of a Standard Cell Library based on Deep Sub-Micron SCMOS Design Rules using Open Source Software (MS Thesis)," Aug. 1, 2005.
Kubicki, "Intel 65nm and Beyond (or Below): IDF Day 2 Coverage (available at http://www.anandtech.com/show/1468/4)," Sep. 9, 2004.
Kuhn, Kelin J., "Reducing Variation in Advanced Logic Technologies: Approaches to Process and Design for Manufacturability of Nanoscale CMOS," p. 27, Dec. 12, 2007.
Kurokawa, Atsushi et al., "Dummy Filling Methods for Reducing Interconnect Capacitance and Number of Fills, Proc. of ISQED," pp. 586-591, 2005.
Lavin, Mark, "Open Access Requirements from RDR Design Flows," Nov. 11, 2004.
Liebmann, Lars et al., "Layout Methodology Impact of Resolution Enhancement Techniques," pp. 5-6, 2003.
Liebmann, Lars et al., "TCAD development for lithography resolution enhancement," Sep. 2001.
Lin, Chung-Wei et al., "Recent Research and Emerging Challenges in Physical Design for Manufacturability/Reliability," Jan. 26, 2007.
McCullen, Kevin W., "Layout Techniques for Phase Correct and Gridded Wiring," pp. 13, 17, Fig. 5, 2006.
Mosis, "Design Rules MOSIS Scalable CMOS (SCMOS) (Revision 8.00)," Oct. 4, 2004.
Mosis, "MOSIS Scalable CMOS (SCMOS) Design Rules (Revision 7.2), 1995.".

(56) References Cited

OTHER PUBLICATIONS

Muta et al., "Manufacturability-Aware Design of Standard Cells," pp. 2686-2690, Figs. 3, 12, Dec. 2007.
Na, Kee-Yeol et al., "A Novel Single Polysilicon EEPROM Cell With a Polyfinger Capacitor," Nov. 30, 2007.
Pan et al., "Redundant Via Enahnced Maze Routing for Yield Improvement," 2005.
Park, Tae Hong, "Characterization and Modeling of Pattern Dependencies in Copper Interconnects for Integrated Circuits," Ph.D. Thesis, MIT, 2002.
Patel, Chetan, "An Architectural Exploration of Via Patterned Gate Arrays (CMU Master's Project)," May 2003.
Pease, R. Fabian et al., "Lithography and Other Patterning Techniques for Future Electronics," 2008.
Serrano, Diego Emilio, Pontificia Universidad Javeriana Facultad de Ingenieria, Departamento de Electronica, "Diseño de Multiplicador 4 X 8 en VLSI, Introduccion al VLSI," 2006.
Pramanik, "Impact of layout on variability of devices for sub 90nm technologies," 2004.
Pramanik, Dipankar et al., "Lithography-driven layout of logic cells for 65-nm node (SPIE Proceedings vol. 5042)," Jul. 10, 2003.
Roy et al., "Extending Aggressive Low-K1 Design Rule Requirements for 90 and 65 Nm Nodes Via Simultaneous Optimization of Numerical Aperture, Illumination and Optical Proximity Correction," J.Micro/Nanolith, MEMS MOEMS, 4(2), 023003, Apr. 26, 2005.
Saint, Christopher et al., "IC Layout Basics: A Practical Guide," Chapter 3, Nov. 5, 2001.
Saint, Christopher et al., "IC Mask Design: Essential Layout Techniques," 2002.
Scheffer, "Physical CAD Changes to Incorporate Design for Lithography and Manufacturability," Feb. 4, 2004.
Smayling, Michael C., "Part 3: Test Structures, Test Chips, In-Line Metrology & Inspection," 2006.
Spence, Chris, "Full-Chip Lithography Simulation and Design Analysis: How OPC is changing IC Design, Emerging Lithographic Technologies IX," May 6, 2005.
Subramaniam, Anupama R., "Design Rule Optimization of Regular layout for Leakage Reduction in Nanoscale Design," pp. 474-478, Mar. 24, 2008.
Tang, C. W. et al., "A compact large signal model of LDMOS," 2002.
Taylor, Brian et al., "Exact Combinatorial Optimization Methods for Physical Design of Regular Logic Bricks," Jun. 8, 2007.
Tian, Ruiqi et al., "Dummy Feature Placement for Chemical-Mechanical Uniformity in a Shallow Trench Isolation Process," IEEE Trans. on Computer-Aided Design of Integrated Circuits and Systems, vol. 21, No. 1, pp. 63-71, Jan. 2002.
Tian, Ruiqi et al., "Proximity Dummy Feature Placement and Selective Via Sizing for Process Unifoimity in a Trench-First-Via-Last Dual-Inlaid Metal Process," Proc. of IITC, pp. 48-50, 2001.
Torres, J. A. et al., "RET Compliant Cell Generation for sub-130nm Processes," 2002.
Uyemura, John P., "Introduction to VLSI Circuits and Systems," Chapters 2, 3, 5, and Part 3, 2002.
Uyemura, John, "Chip Design for Submicron VLSI: CMOS Layout and Simulation," Chapters 2-5, 7-9, Feb. 8, 2005.
Verhaegen et al., "Litho Enhancements for 45nm-nod MuGFETs," Aug. 1, 2005.
Wong, Ban P., "Bridging the Gap between Dreams and Nano-Scale Reality (DAC-2006 DFM Tutorial)," 2006.
Wang, Dunwei et al., "Complementary Symmetry Silicon Nanowire Logic: Power-Efficient Inverters with Gain," 2006.
Wang, Jun et al., "Effects of grid-placed contacts on circuit performance," pp. 135-139, Figs. 2, 4-8, Feb. 28, 2003.
Wang, Jun et al., "Standard cell design with regularly placed contacts and gates (SPIE vol. 5379)," 2004.
Wang, Jun et al., "Standard cell design with resolution-enhancement-techniquedriven regularly placed contacts and gates," J. Micro/Nanolith, MEMS MOEMS, 4(1), 013001, Mar. 16, 2005.
Watson, Bruce, "Challenges and Automata Applications in Chip-Design Software," pp. 38-40, 2007.
Weste, Neil et al., "CMOS VLSI Design: A Circuits and Systems Perspective, 3rd Edition," May 21, 2004.
Wingerden, Johannes van, "Experimental verification of improved printability for litho-driven designs," Mar. 14, 2005.
Wong, Alfred K., "Microlithography: Trends, Challenges, Solutions, and Their Impact on Design," 2003.
Xu, Gang, "Redundant-Via Enhanced Maze Routing for Yield Improvement," 2005.
Yang, Jie, "Manufacturability Aware Design," pp. 93, 102, Fig. 5.2, 2007.
Yongshun, Wang et al., "Static Induction Devices with Planar Type Buried Gate," 2004.
Zobrist, George (editor), "Progress in Computer Aided VLSI Design: Implementations (Ch. 5)," 1990.

\* cited by examiner

COARSE GRID DESIGN METHODS AND STRUCTURES

CLAIM OF PRIORITY

This application claims priority under 35 U.S.C. 119(e) to U.S. Provisional Patent Application No. 61/487,247, filed May 17, 2011, entitled "Coarse Grid Design Methods and Structures," the disclosure of which is incorporated herein by reference in its entirety.

This application is also a continuation-in-part application under 35 U.S.C. 120 of prior U.S. application Ser. No. 12/572,022, filed Oct. 1, 2009, now U.S. Pat. No. 8,253,173 which is a continuation application under 35 U.S.C. 120 of prior U.S. application Ser. No. 12/212,562, filed Sep. 17, 2008, now U.S. Pat. No. 7,842,975 which is a continuation application under 35 U.S.C. 120 of prior U.S. application Ser. No. 11/683,402, filed Mar. 7, 2007, now U.S. Pat. No. 7,446,352 which claims priority under 35 U.S.C. 119(e) to U.S. Provisional Patent Application No. 60/781,288, filed Mar. 9, 2006. Each of the above-identified applications is incorporated herein by reference in its entirety.

This application is also a continuation-in-part application under 35 U.S.C. 120 of prior U.S. application Ser. No. 13/073,994, filed Mar. 28, 2011, now U.S. Pat. No. 8,356,268 which is a continuation application under 35 U.S.C. 120 of prior U.S. application Ser. No. 12/013,342, filed Jan. 11, 2008, now U.S. Pat. No. 7,917,879 which claims priority under 35 U.S.C. 119(e) to each of 1) U.S. Provisional Patent Application No. 60/963,364, filed Aug. 2, 2007, and 2) U.S. Provisional Patent Application No. 60/972,394, filed Sep. 14, 2007. Each of the above-identified applications is incorporated herein by reference in its entirety.

This application is also a continuation-in-part application under 35 U.S.C. 120 of prior U.S. application Ser. No. 12/753,795, filed Apr. 2, 2010, now U.S. Pat. No. 8,258,581 which is a continuation application under 35 U.S.C. 120 of prior U.S. application Ser. No. 12/402,465, filed Mar. 11, 2009, now U.S. Pat. No. 7,956,241 which claims priority under 35 U.S.C. 119(e) to each of 1) U.S. Provisional Patent Application No. 61/036,460, filed Mar. 13, 2008, and 2) U.S. Provisional Patent Application No. 61/042,709, filed Apr. 4, 2008, and 3) U.S. Provisional Patent Application No. 61/045,953, filed Apr. 17, 2008, and 4) U.S. Provisional Patent Application No. 61/050,136, filed May 2, 2008. Each of the above-identified applications is incorporated herein by reference in its entirety.

BACKGROUND

Until recently, integrated circuit (IC) scaling has been enabled to a large extent by improvements in photolithography equipment resolution and overlay. The resolution capability of the photolithography equipment was such that random logical functions could be drawn with two-dimensional (2D) bent shapes, with few restrictions on shape dimensions or relationships between shapes.

Traditional 2D designs have layout shape edges which can fall on a very fine grid, such as on a 1 nm (nanometer) grid, by way of example. A direct writing tool using a raster pattern needs to write along the finest grid on each design/pattern layer of an integrated circuit device (sometimes called a mask layer) in order to correctly place all edges of the layout shapes. Also, 2D layout patterns need to be written completely in two directions, resulting in a large amount of data for each layer to be written. It is within this context that the present invention arises.

SUMMARY

In one embodiment, a method is disclosed for fabricating an integrated circuit. The method includes depositing a layer of a mask material on a substrate. The method also includes scanning a beam of energy across the mask material in a rasterized linear pattern and in accordance with a scan pitch that is based on a pitch of conductive structure segments to be formed on the substrate. The beam of energy is defined to transform the mask material upon which the beam of energy is incident into a removable state. During scanning the beam of energy across the mask material, the beam of energy is turned on at locations where a conductive structure is to be formed on the substrate, and the beam of energy is turned off at locations where a conductive structure is not to be formed on the substrate.

In one embodiment, a method is disclosed for fabricating an integrated circuit. The method includes depositing a layer of a mask material on a substrate. The method also includes scanning a beam of energy across the mask material in a rasterized linear pattern and in accordance with a scan pitch that is equal to at least a width of the beam of energy as measured in a direction perpendicular to a scan direction of the beam of energy. The beam of energy is defined to transform the mask material upon which the beam of energy is incident into a removable state. During scanning the beam of energy across the mask material, the beam of energy is turned on at locations where a conductive structure is to be formed on the substrate, and the beam of energy is turned off at locations where a conductive structure is not to be formed on the substrate.

Other aspects and advantages of the invention will become more apparent from the following detailed description, taken in conjunction with the accompanying drawings, illustrating by way of example the present invention.

DETAILED DESCRIPTION

Figure 1:
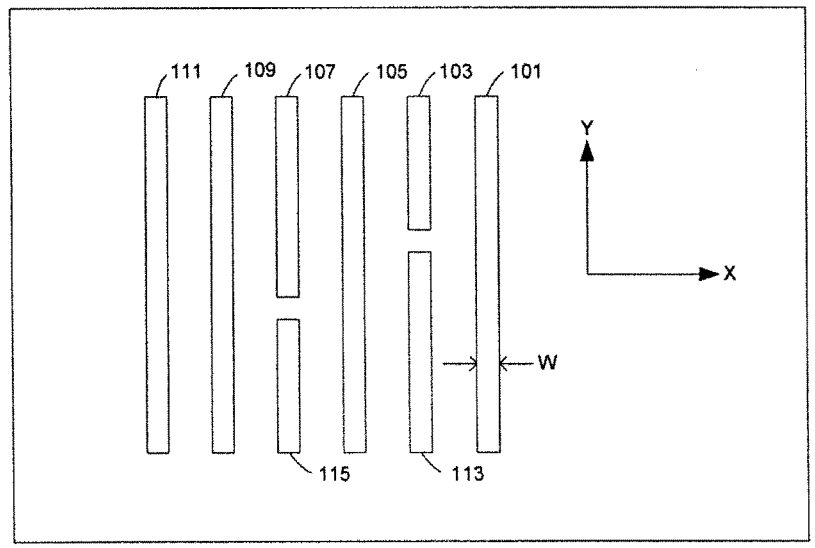
FIG. 1 shows a plan view of a portion of a gate electrode layer of an example logic circuit, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

As optical lithography has reached a cost-driven limit of the 193 nm ArF excimer laser light source and a lens numerical aperture of 0.93 (or 1.35 for water immersion systems), other approaches are required for fabrication of smaller IC feature sizes. One approach is spacer double patterning (SDP), in which the layout pattern is split into two parts, each of which can be processed with optical lithography equipment. With spacer double/triple/quadruple/etc. patterning, pitch division can extend line patterns to smaller and smaller feature sizes until some other limit is reached. The SDP approach uses the following sequence to reduce the pattern pitch by a factor of two:

1. standard optical lithography to pattern a "core"
2. etch the core and remove the resist
3. deposit a different material which can be etched selectively relative to the core
4. etch the deposited film, leaving sidewall material and the core
5. etch the core, leaving only the sidewall material
6. cut the sidewall material to create separate parts
7. etch the underlying material using the sidewall material as the mask
8. remove the sidewall material, leaving the underlying material with the desired pattern.

A method of chip design and fabrication is described herein which uses a coarse grid layout. The coarse grid methods described herein may be implemented with or without the multiple patterning approach discussed above. In the coarse grid method, lines, cuts, and holes are positioned on the coarse grid. The coarse grid has a granularity set by the requirements of a particular IC layer. Structures to be fabricated on a semiconductor wafer are specified by lines, cuts, holes, or any combination thereof, on a coarse grid. In one example embodiment, the layout pattern of the structures to be fabricated can include one-dimensional (1D) lines and cuts and holes, as needed. In another example embodiment, the layout pattern of the structures to be fabricated can include 1D line segments and holes, as needed. In another example embodiment, the layout pattern of the structures to be fabricated can be 1D and 2D coarse-grid line segments and holes, as needed. The coarse grid applied to cuts and holes is also extendable. With electron beams, a feature size limit is on the order of less than 10 nm.

FIG. 1 shows a plan view of a portion of a gate electrode layer of an example logic circuit, in accordance with one embodiment of the present invention. The portion of the gate electrode layer includes gate lines 101, 103, 105, 107, 109, 111, 113, 115. Each gate line 101, 103, 105, 107, 109, 111, 113, 115 is defined to extend lengthwise in a first direction (Y direction). It should be understood that the gate lines correspond to conductive structures formed within the portion of the gate electrode layer. The gate lines 101, 103, 105, 107, 109, 111, 113, 115 in the example of FIG. 1 are shown to have uniform gate line-widths W, as measured in a second direction (X direction) substantially perpendicular to the first direction (Y direction).

Figure 2:
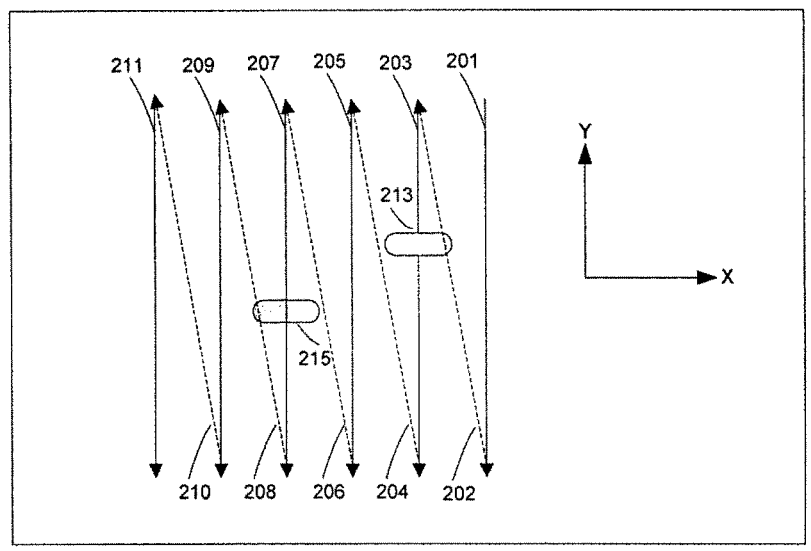
FIG. 2 shows a plan view of a possible scan pattern used to write "cuts" in the gate lines of the portion of the gate electrode layer of FIG. 1, in accordance with one embodiment of the present invention.

FIG. 2 shows a plan view of a possible scan pattern used to write "cuts" 213, 215 in the gate lines of the portion of the gate electrode layer of FIG. 1, in accordance with one embodiment of the present invention. Scan lines 201, 203, 205, 207, 209, 211 are centered and co-linear with a gate line pattern corresponding to the gate lines 101, 103, 105, 107, 109, 111, 113, 115. The scan pattern also includes retrace lines 202, 204, 206, 208, 210. The beam is turned on at the cut 213, 215 locations. The shape of the cuts 213, 215 as shown in FIG. 2 is provided by way of example. In various embodiments, the shape of the cuts 213, 215 can be rectangular or oval, among other shapes, as long as a size of the cut 213, 215 as measured in a direction perpendicular to the scan lines, i.e., X direction in FIG. 2, is large enough to overlap the line to be cut, even with worst-case layer-to-layer overlay misalignment. It should be understood that the flexibility in the shape of the cuts 213, 215 applies to other cuts discussed hereafter.

Figure 3:
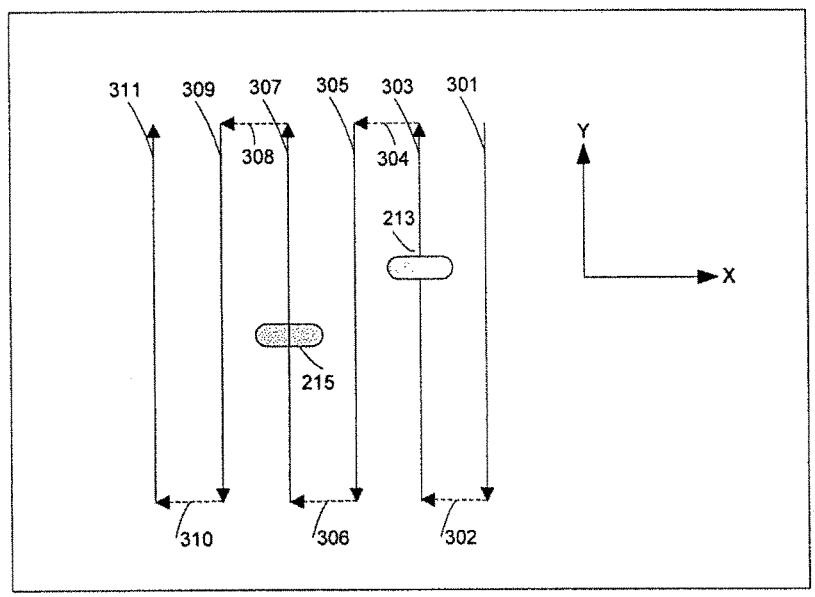
FIG. 3 shows a plan view of another possible scan pattern used to write the cuts in the gate lines of the portion of the gate electrode layer of FIG. 1, in accordance with one embodiment of the present invention.

FIG. 3 shows a plan view of another possible scan pattern used to write the cuts 213, 215 in the gate lines of the portion of the gate electrode layer of FIG. 1, in accordance with one embodiment of the present invention. Scan lines 301, 303, 305, 307, 309, 311 are centered and co-linear with the gate line pattern corresponding to the gate lines 101, 103, 105, 107, 109, 111, 113, 115. The scan pattern also includes retrace lines 302, 303, 306, 308, 310. The beam is turned on at the cut 213, 215 locations.

Figure 4:
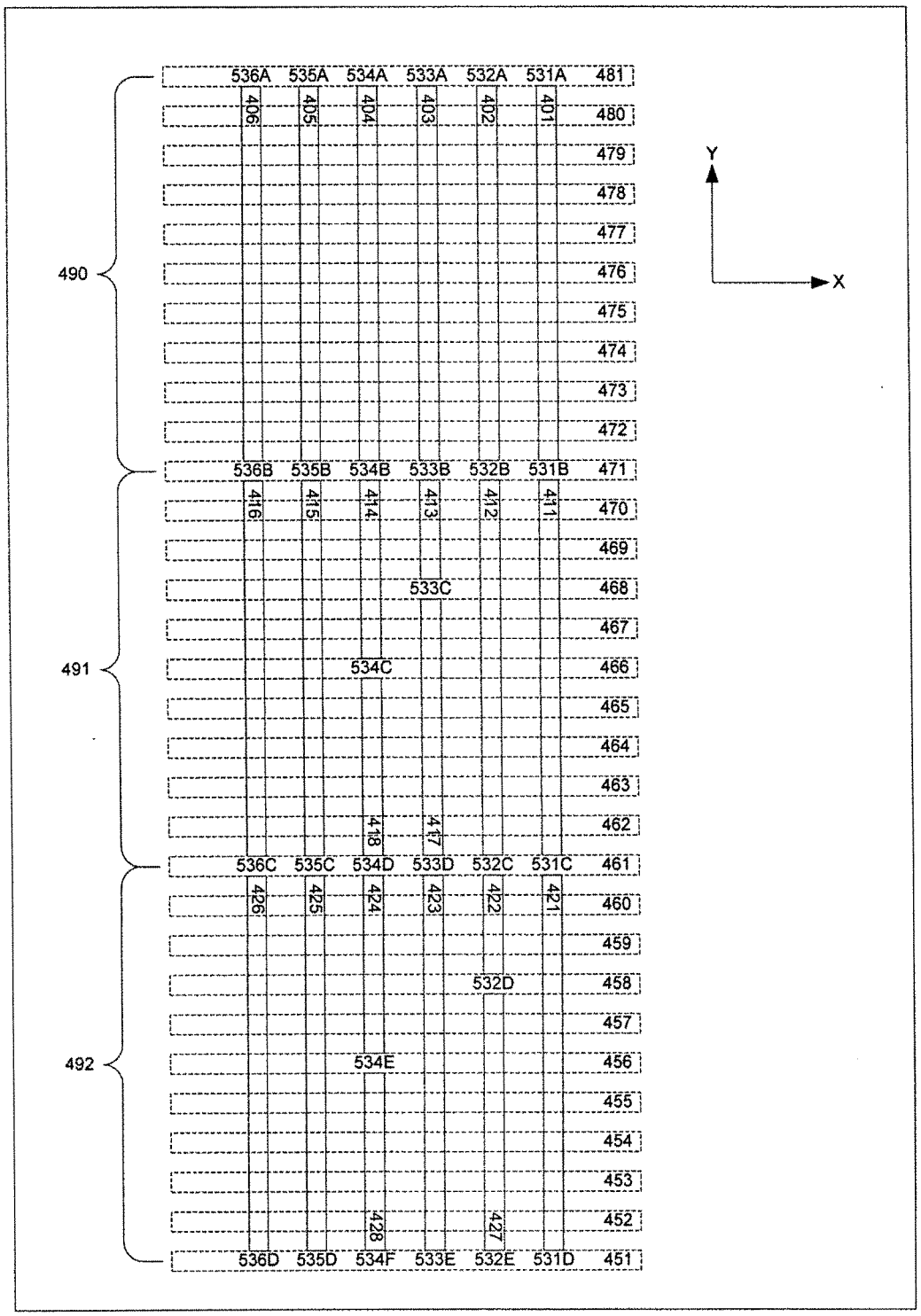
FIG. 4 shows a plan view of a portion of a gate electrode layer of an example logic circuit block including three rows of logic cells in a column, in accordance with one embodiment of the present invention.

FIG. 4 shows a plan view of a portion of a gate electrode layer of an example logic circuit block including three rows of logic cells in a column, in accordance with one embodiment of the present invention. A first row 490 of logic cells includes gate lines 401, 402, 403, 404, 405, 406. A second row 491 of logic cells includes gate lines 411, 412, 413, 414, 415, 416, 417, 418. A third row 492 of logic cells includes gate lines 421, 422, 423, 424, 425, 426, 427, 428. Cuts 531A-536A, 531B-536B, 531C-536C, 531D-536D, 532E-534E, 534F are formed in the gate lines on a common coarse grid in the X direction. In one embodiment, Metal-1 horizontal lines 451-481 corresponding to Metal-1 conductive structures are shown by the dashed rectangles. In various embodiments, the cuts 531A-536A, 531B-536B, 531C-536C, 531D-536D, 532E-534E, 534F can be positioned either on the Y grid formed by the Metal-1 horizontal lines 451-481 or not, depending on the beam writer resolution along a raster line.

Figure 5:
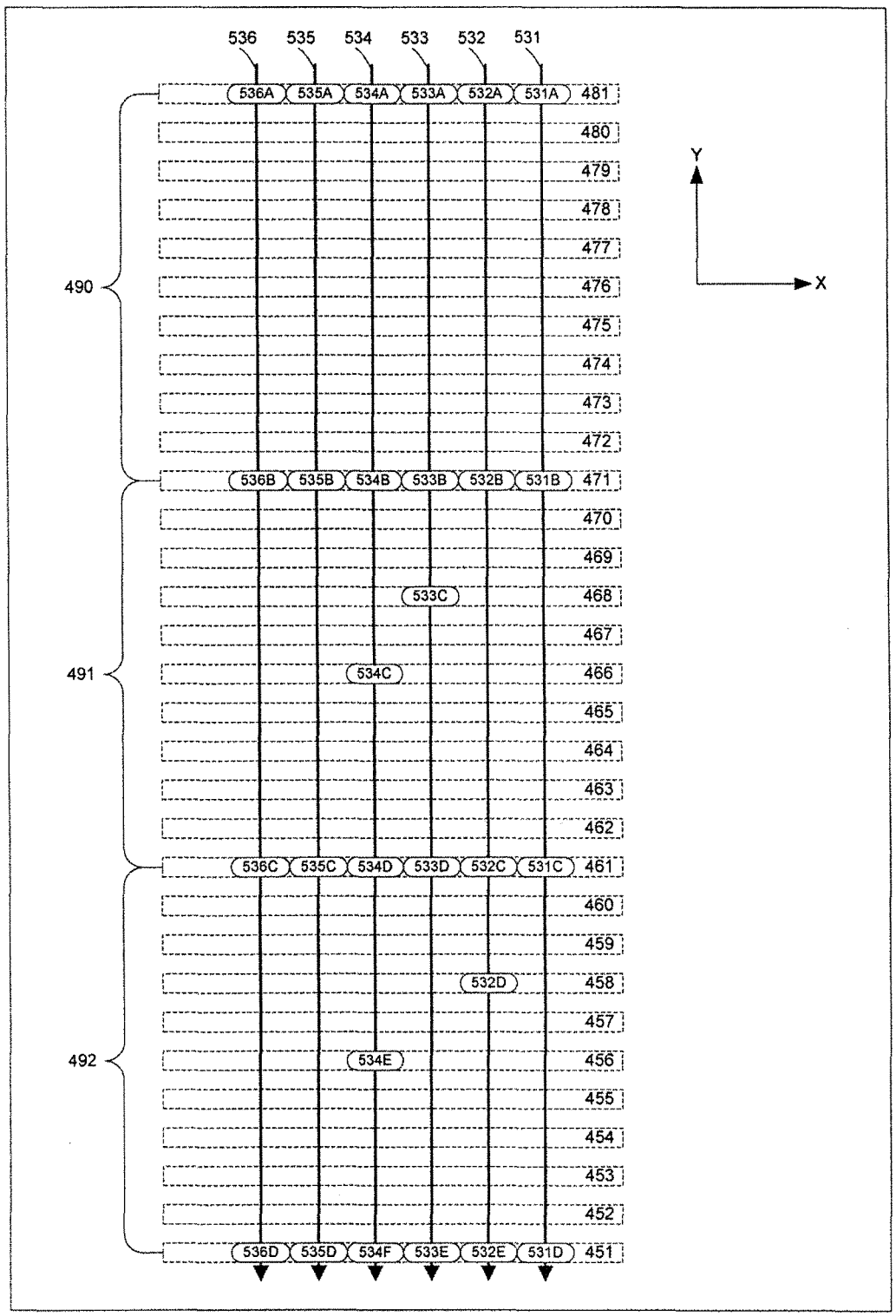
FIG. 5 shows a plan view of a possible scan pattern used to write the cuts in the portion of the gate electrode layer of FIG. 4, in accordance with one embodiment of the present invention.

FIG. 5 shows a plan view of a possible scan pattern used to write the cuts 531A-536A, 531B-536B, 531C-536C, 531D-536D, 532E-534E, 534F in the portion of the gate electrode layer of FIG. 4, in accordance with one embodiment of the present invention. Scan lines 531, 532, 533, 534, 535, 536 are centered and co-linear with the gate line pattern corresponding to the gate lines 401, 402, 403, 404, 405, 406, 411, 412, 413, 414, 415, 416, 417, 418, 421, 422, 423, 424, 425, 426, 427, 428. The retrace lines are not shown in FIG. 5 to avoid cluttering the figure. However, it should be understood that the retrace lines in the example of FIG. 5 could be implemented as shown in the example embodiments of either FIG. 2 or FIG. 3. Also, it should be understood that the beam scan lines 531, 532, 533, 534, 535, 536 and initial lines of the gate electrodes may extend above and below the top and bottom rows of cuts.

Figure 6:
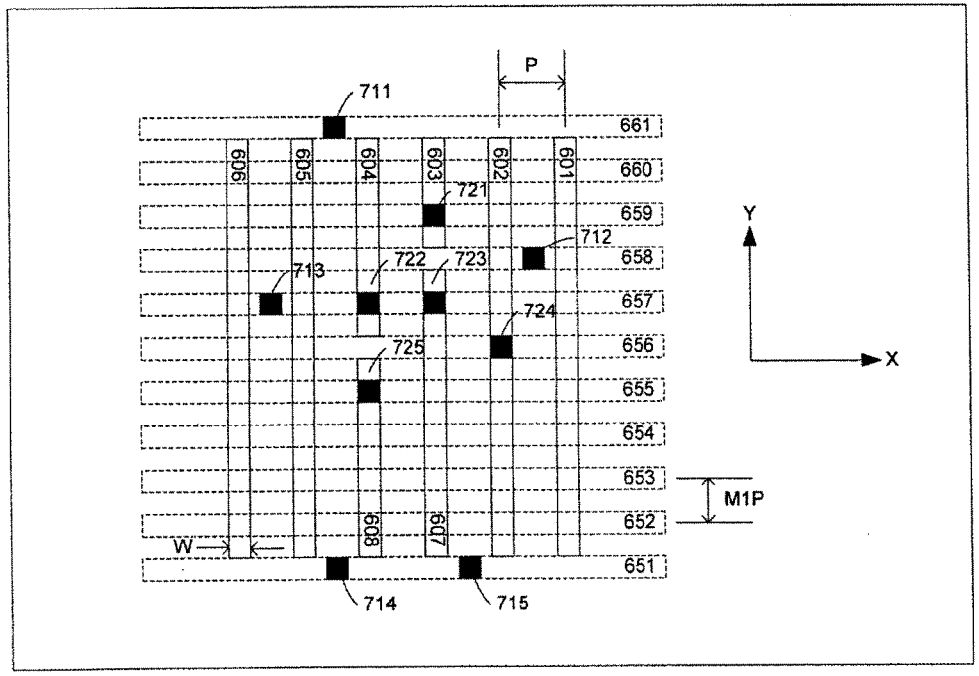
FIG. 6 shows a plan view of a portion of a gate electrode layer and a corresponding portion of a contact layer of an example logic circuit, in accordance with one embodiment of the present invention.

FIG. 6 shows a plan view of a portion of a gate electrode layer and a corresponding portion of a contact layer of an example logic circuit, in accordance with one embodiment of the present invention. The portion of the gate electrode layer includes gate lines 601, 602, 603, 604, 605, 606, 607, 608 defined to extend lengthwise in a first direction Y. In one embodiment, Metal-1 horizontal lines 651-661 corresponding to Metal-1 conductive structures are shown by the dashed rectangles. In one embodiment, the Metal-1 horizontal lines 651-661 are centered on a fixed pitch (M1P) as measured in the Y direction. FIG. 6 also shows diffusion contacts 711, 712, 713, 714, 715 corresponding to conductive structures formed to physically contact a diffusion region, i.e., active region, underlying the portion of the gate electrode layer. For clarity, the diffusion/active regions are not shown in FIG. 6. FIG. 6 also shows gate contacts 721, 722, 723, 724, 725 corresponding to conductive structures formed to physically contact a conductive structure corresponding to gate lines 603, 604, 607, 602, 608, respectively.

Figure 7:
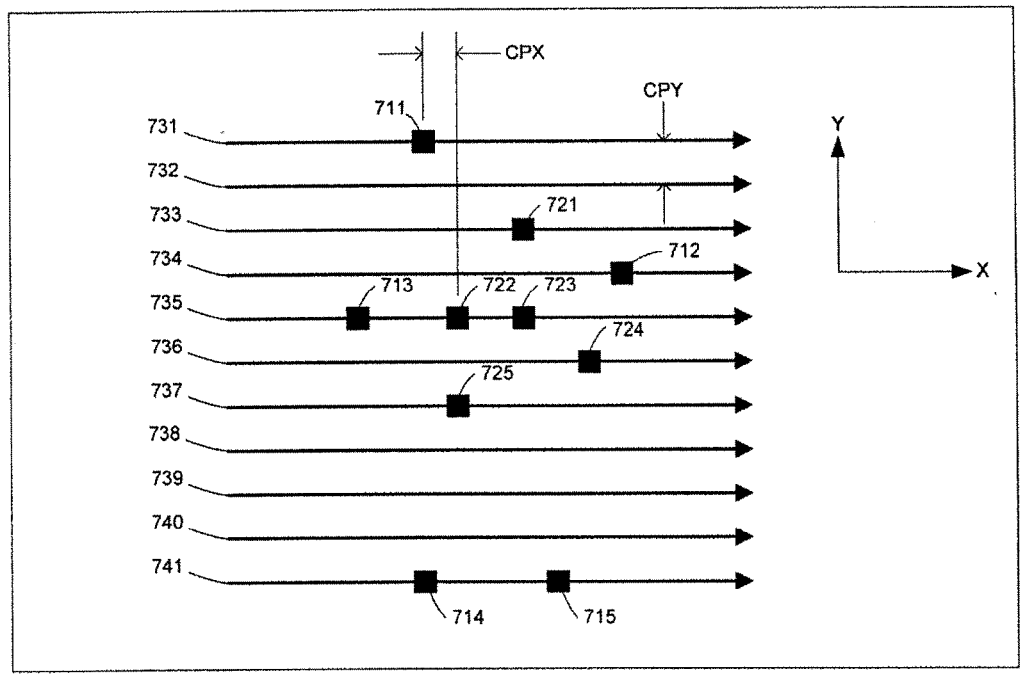
FIG. 7 shows a plan view of a possible scan pattern used to write the diffusion and gate contacts in the example logic circuit of FIG. 6, in accordance with one embodiment of the present invention.

FIG. 7 shows a plan view of a possible scan pattern used to write the diffusion and gate contacts (711-715, 721-725) in the example logic circuit of FIG. 6, in accordance with one embodiment of the present invention. The scan pattern includes scan lines 731-741. The retrace lines are not show in FIG. 7 to avoid cluttering the figure. However, it should be understood that the retrace lines in the example of FIG. 7 could be implemented in a manner similar to that shown in the example embodiments of either FIG. 2 or FIG. 3. The scan lines 731-741 may extend to the left and right of the logic cell or row of logic cells within which the example logic circuit resides. Also, it should be appreciated that the scan lines 731-741 are oriented in the horizontal direction, i.e., X direction, to reduce the number of scan lines needed.

For example, since there are both diffusion and gate contacts (711-715, 721-725) to be formed, the X pitch (CPX) of the contact scan is one-half of the gate pitch (P) as shown in FIG. 6. Also, since the diffusion and gate contacts (711-715, 721-725) are to be placed along a metal line, the Y pitch (CPY) of the contact scan is substantially equal to the Metal-1 pitch (M1P) as shown in FIG. 6. In one embodiment, a width (W) of the gate lines 601-608 is about 22 nm (nanometers). In this embodiment, the gate pitch (P) is about 90 nm, and the Metal-1 pitch (M1P) is about 70 nm. Because the Metal-1 pitch (M1P) of about 70 nm is larger than one-half of the gate pitch (P) (90 nm/2=45 nm), then a given area of the scan pattern can be covered with fewer scan lines using a scan pattern oriented in the horizontal direction (X direction), with a Y pitch (CPY) of the contact scan that is substantially equal to the Metal-1 pitch (M1P). Although the horizontal scan shown in FIG. 7 requires fewer scan lines, it should be understood that a vertical scan direction (Y direction) may be chosen if there are other constraints such as equipment hardware limitations.

Figure 8:
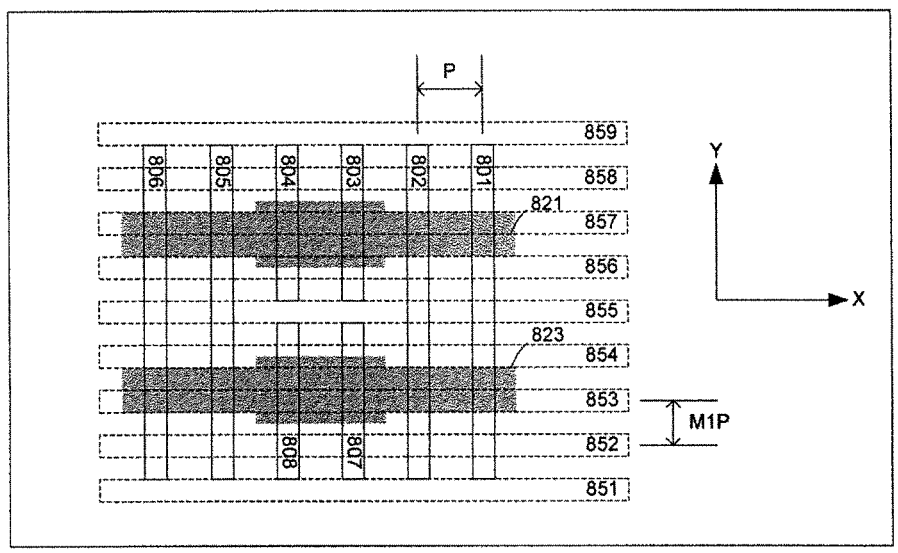
FIG. 8 shows a plan view of a portion of a gate electrode layer and a corresponding portion of a diffusion/active layer of an example circuit, in accordance with one embodiment of the present invention.

FIG. 8 shows a plan view of a portion of a gate electrode layer and a corresponding portion of a diffusion/active layer of an example circuit, in accordance with one embodiment of the present invention. The example circuit of FIG. 8 may be either a logic circuit or a memory circuit. The portion of the gate electrode layer includes gate lines 801-808 defined to extend lengthwise in a first direction Y. The gate lines 801-808 are centered on a gate pitch (P) as measured in the X direction. In one embodiment, Metal-1 horizontal lines 851-859 corresponding to Metal-1 conductive structures are shown by the dashed rectangles. In one embodiment, the Metal-1 horizontal lines 851-859 are centered on a fixed pitch (M1P) as measured in the Y direction.

FIG. 8 also shows diffusion/active regions 821 and 823. As shown in FIG. 8, the diffusion/active regions can be divided into strips which each have a width as measured in the Y direction that is a fraction of the Metal-1 pitch (M1P). For example, in some embodiments, the strips into which the diffusion/active regions 821, 823 are divided have a width as measured in the Y direction that is either one-fourth (¼) or one-eighth (⅛) of the Metal-1 pitch (M1P). In the example of FIG. 8, the centers of the diffusion/active regions 821, 823 are vertically aligned, such that a single line extending in the Y direction passes through the centers of the diffusion/active regions 821, 823. However, it should be understood that in other embodiments the diffusion/active regions 821, 823 may not be vertically aligned.

Figure 9:
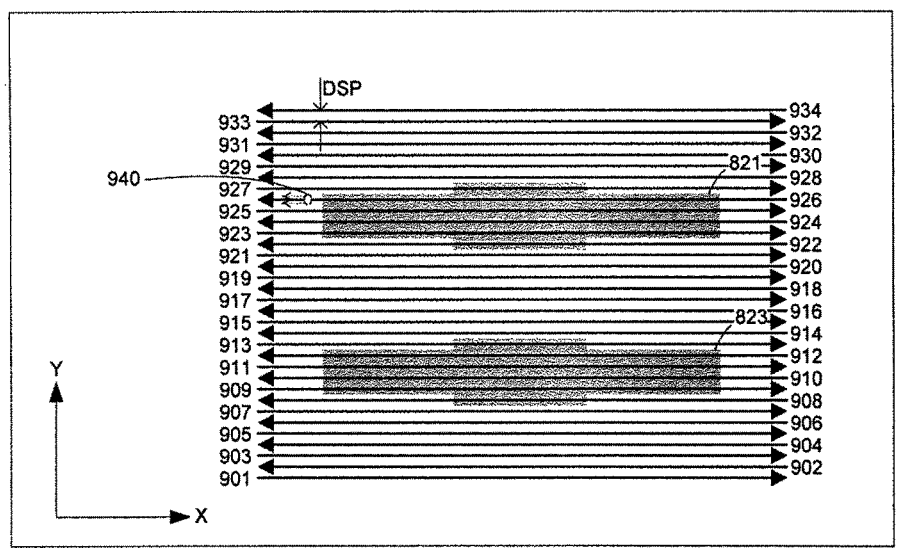
FIG. 9 shows a plan view of a possible scan pattern used to write the diffusion/active regions in the example circuit of FIG. 8, in accordance with one embodiment of the present invention.

FIG. 9 shows a plan view of a possible scan pattern used to write the diffusion/active regions 821, 823 in the example circuit of FIG. 8, in accordance with one embodiment of the present invention. The scan pattern includes scan lines 901-934. The retrace lines are not show in FIG. 9 to avoid cluttering the figure. However, it should be understood that the retrace lines in the example of FIG. 9 could be implemented in a manner similar to that shown in the example embodiments of either FIG. 2 or FIG. 3. The scan lines 901-934 are oriented in the horizontal direction (X direction) and may extend to the left and/or right of the logic/memory cell or row of logic/memory cells in which the example circuit is formed. In this example embodiment, the scan direction is perpendicular to a length direction of the gate lines 801-808. The example scan pattern shown in FIG. 9 has a scan pitch (DSP) as measured in the Y direction that is one-fourth (¼) of the Metal-1 pitch (M1P) as measured in the Y direction. A scan beam cross-section 940 size as measured in the Y direction is equal to a width of a scan line plus some small extension (e.g., 1 nm to 5 nm, by way of example) to account for overlay as the beam is scanned side-to-side.

As shown in FIG. 9, scan lines 908-913 and 922-927 require switching of the beam ("on" for negative photoresist, "off" for positive photoresist) to produce strips of the diffusion/active regions 823 and 821, respectively. Also, scan lines 901-907, 914-921, 928-934 do not require switching of the beam. It should be appreciated that the scan pitch (DSP), i.e., raster size, of one-fourth of the Metal-1 pitch (M1P) is still relatively coarse as compared to a 1 nm or finer scan pitch that is required to draw/form conventional diffusion/active regions.

Figure 10:
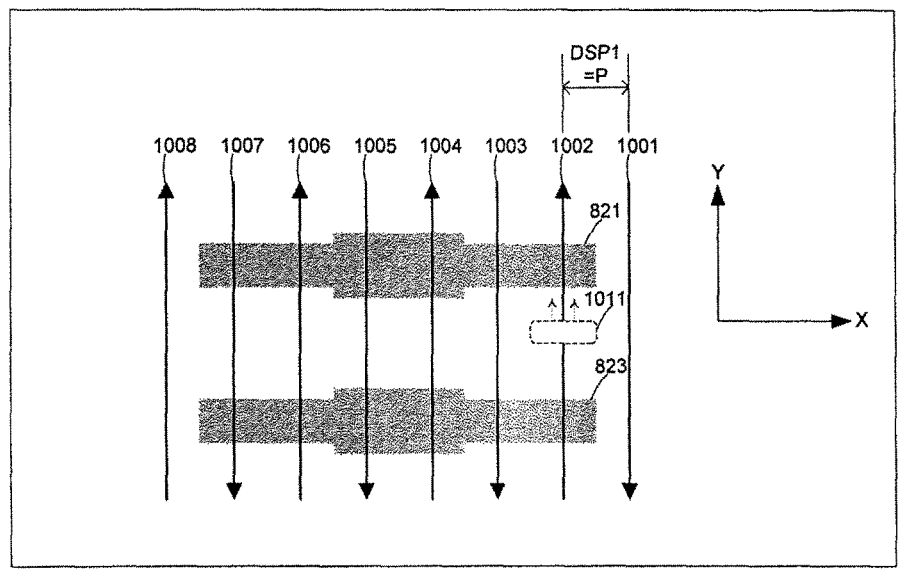
FIG. 10 shows a plan view of another possible scan pattern used to write the diffusion/active regions in the example circuit of FIG. 8, in accordance with one embodiment of the present invention.

FIG. 10 shows a plan view of another possible scan pattern used to write the diffusion/active regions 821, 823 in the example circuit of FIG. 8, in accordance with one embodiment of the present invention. The scan pattern includes scan lines 1001-1008. The scan lines 1001-1008 are oriented in the vertical direction (Y direction) and may extend above and/or below the logic/memory cell or row of logic/memory cells in which the example circuit is formed. In this example embodiment, the scan direction is parallel to a length direction of the gate lines 801-808. The retrace lines are not shown in FIG. 10 to avoid cluttering the figure. However, it should be understood that the retrace lines in the example of FIG. 10 could be implemented in a manner similar to that shown in the example embodiments of either FIG. 2 or FIG. 3.

The example scan pattern shown in FIG. 10 has a scan pitch (DSP1) as measured in the X direction that is substantially equal to a pitch (P) of the gate lines 801-808 as measured in the X direction as shown in FIG. 8. In one embodiment, a scan beam cross-section 1011 size as measured in the X direction is substantially equal to the pitch (P) of the gate lines 801-808 plus some small extension (e.g., 1 nm to 5 nm, by way of example) to account for overlay as the beam is scanned vertically in the Y direction.

As shown in FIG. 10, scan lines 1002-1007 require switching of the beam ("on" for negative photoresist, "off" for positive photoresist) to produce strips of the diffusion/active regions 821 and 823. Also, scan lines 1001 and 1008 do not require switching of the beam. It should be appreciated that the scan pitch (DSP1), i.e., raster size, which is substantially equal to the gate pitch (P) is very coarse as compared to a 1 nm or finer scan pitch that is required to draw/form conventional diffusion/active regions. It should also be appreciated that for vertical scanning in the Y direction (parallel to the length direction of the gate lines 801-808), the diffusion/active region 821, 823 edge placement depends on the timing accuracy of the beam switching (i.e., beam turning on or off depending on the type of photoresist used) and is not necessarily tied to a fraction of the Metal-1 pitch, such as discussed above with regard to the example scan pattern of FIG. 9.

Figure 11:
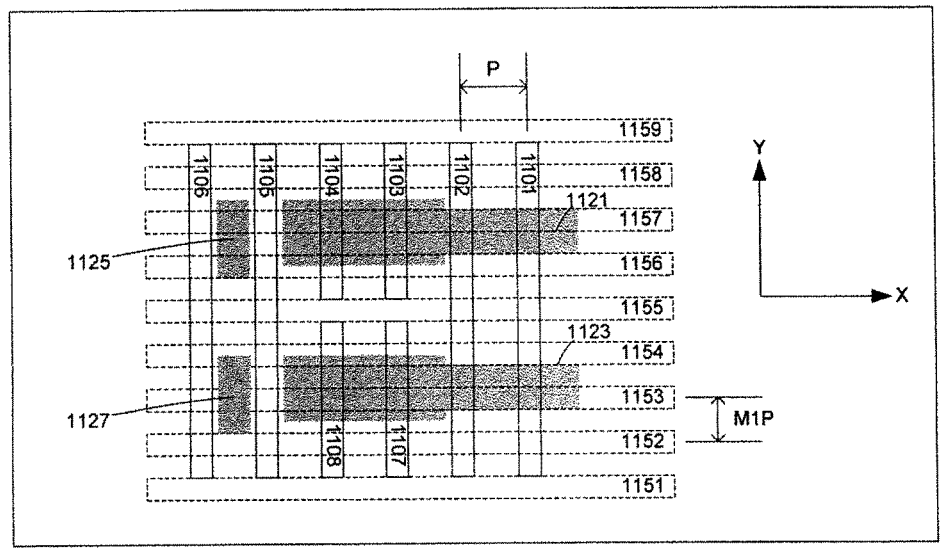
FIG. 11 shows a plan view of a portion of a gate electrode layer and a corresponding portion of a diffusion/active layer of an example circuit, in accordance with one embodiment of the present invention.

FIG. 11 shows a plan view of a portion of a gate electrode layer and a corresponding portion of a diffusion/active layer of an example circuit, in accordance with one embodiment of the present invention. The example circuit of FIG. 11 may be either a logic circuit or a memory circuit. The portion of the gate electrode layer includes gate lines 1101-1108 defined to extend lengthwise in a first direction (Y direction). The gate lines 1101-1108 are centered on a gate pitch (P) as measured in the X direction. In one embodiment, Metal-1 horizontal lines 1151-1159 corresponding to Metal-1 conductive structures are shown by the dashed rectangles. In one embodiment, the Metal-1 horizontal lines 1151-1159 are centered on a fixed pitch (M1P) as measured in the Y direction.

FIG. 11 also shows diffusion/active regions 1121, 1123, 1125, 1127. In the example of FIG. 11, the centers of the diffusion/active regions 1125 and 1127 are vertically aligned and the centers of diffusion/active regions 1121 and 1123 are vertically aligned, such that a single line extending in the Y direction passes through the centers of the diffusion/active regions 1125 and 1127, and such that another single line extending in the Y direction passes through the centers of the diffusion/active regions 1121 and 1123. However, it should be understood that in other embodiments the diffusion/active regions 1125 and 1127 and/or 1121 and 1123 may not be vertically aligned so long as their respective vertical edges are positioned according to a coarse grid of the scan pattern.

For horizontal scanning in the X direction (perpendicular to the gate lines 1101-1108), the diffusion/active regions 1121, 1123, 1125, 1127 can be divided into strips which each have a width as measured in the Y direction that is a fraction of the Metal-1pitch (M1P). For example, in some embodiments, the strips into which the diffusion/active regions 1121, 1123, 1125, 1127 are divided have a width as measured in the Y direction that is either one-fourth (¼) or one-eighth (⅛) of the Metal-1 pitch (M1P). For vertical scanning in the Y direction (parallel to the gate lines 1101-1108) the horizontal edge placement of the diffusion/active regions 1121, 1123, 1125, 1127 depends on the timing accuracy of the beam switching (i.e., beam turning on or off depending on the type of photoresist used) and is not necessarily tied to a fraction of the Metal-1 pitch, such as discussed above with regard to the example scan pattern of FIG. 9.

Figure 12:
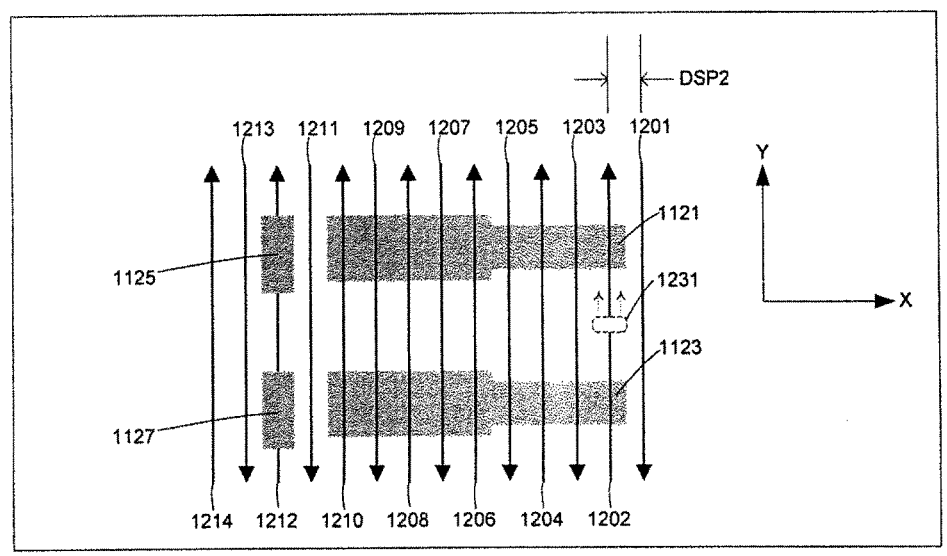
FIG. 12 shows a plan view of a possible scan pattern used to write the diffusion/active regions in the example circuit of FIG. 11, in accordance with one embodiment of the present invention.

FIG. 12 shows a plan view of a possible scan pattern used to write the diffusion/active regions 1121, 1123, 1125, 1127 in the example circuit of FIG. 11, in accordance with one embodiment of the present invention. The scan pattern includes scan lines 1201-1214. The scan lines 1201-1214 are oriented in the vertical direction (Y direction) and may extend above and/or below the logic/memory cell or row of logic/memory cells in which the example circuit is formed. In this example embodiment, the scan direction is parallel to a length direction of the gate lines 1101-1108. The retrace lines are not shown in FIG. 12 to avoid cluttering the figure. However, it should be understood that the retrace lines in the example of FIG. 12 could be implemented in a manner similar to that shown in the example embodiments of either FIG. 2 or FIG. 3.

The example scan pattern shown in FIG. 12 has a scan pitch (DSP2) as measured in the X direction that is substantially equal to one-half (½) of the gate pitch (P) of the gate lines 1101-1108 as measured in the X direction as shown in FIG. 11. Therefore, each of the scan lines 1201-1214 is substantially aligned with either a lengthwise centerline of one of the gate lines 1101-1108, or one of the midpoint locations between the lengthwise centerlines of a neighboring pair of the gate lines 1101-1108.

In one embodiment, a scan beam cross-section 1231 size as measured in the X direction is substantially equal to one-half (½) of the gate pitch (P) of the gate lines 801-808 plus some small extension (e.g., 1 nm to 5 nm, by way of example) to account for overlay as the beam is scanned vertically in the Y direction. As shown in FIG. 12, scan lines 1202-1210 and 1212 require switching of the beam ("on" for negative photoresist, "off" for positive photoresist) to produce strips of the diffusion/active regions 1121, 1123, 1125, 1127. Also, scan lines 1201, 1211, 1214 do not require switching of the beam.

It should be appreciated that the scan pitch (DSP2), i.e., raster size, which is substantially equal to one-half (½) of the gate pitch (P) is very coarse as compared to a 1 nm or finer scan pitch that is required to draw/form conventional diffusion/active regions. It should also be appreciated that for vertical scanning in the Y direction (parallel to the length direction of the gate lines 1101-1108), the edge placement of the diffusion/active regions 1121, 1123, 1125, 1127 depends on the timing accuracy of the beam switching (i.e., beam turning on or off depending on the type of photoresist used) and is not necessarily tied to a fraction of the Metal-1 pitch, such as discussed above with regard to the example scan pattern of FIG. 9. Therefore, the final vertical sizes of the diffusion/active regions 1121, 1123, 1125, 1127 are determined by the accuracy of the beam switching.

Figure 13:
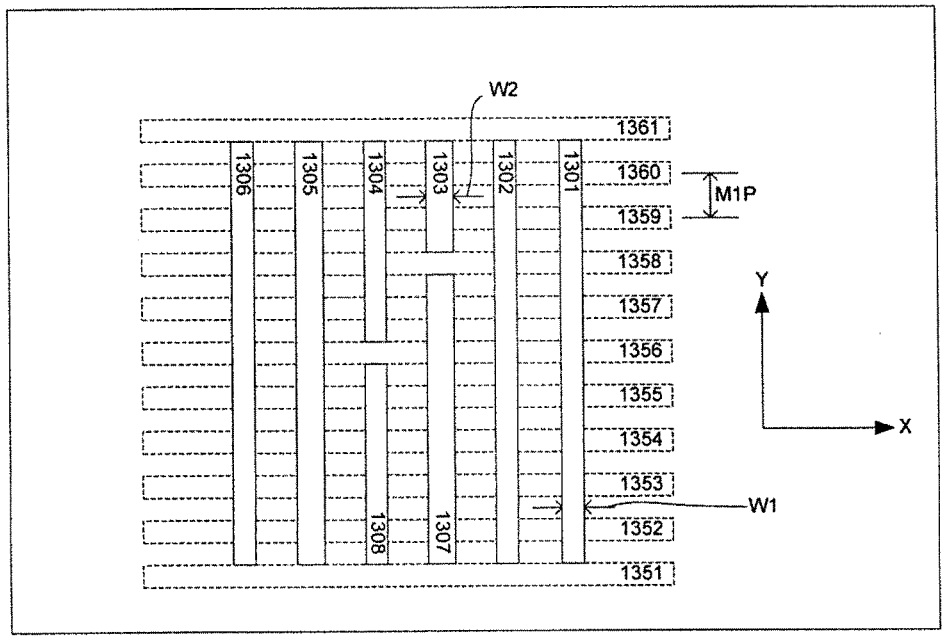
FIG. 13 shows a plan view of a portion of a gate electrode layer of an example circuit that includes non-uniform gate line widths, in accordance with one embodiment of the present invention.

FIG. 13 shows a plan view of a portion of a gate electrode layer of an example circuit that includes non-uniform gate line widths, in accordance with one embodiment of the present invention. The example circuit of FIG. 13 may be either a logic circuit or a memory circuit. The portion of the gate electrode layer includes gate lines 1301-1308. It should be understood that the gate lines 1301-1308 correspond to conductive structures formed within the portion of the gate electrode layer. Each gate line 1301-1308 is defined to extend lengthwise in a first direction Y. Gate lines 1301, 1302, 1304, 1306, 1308 have a first width (W1) as measured in the X direction. Gate lines 1303, 1305, 1307 have a second width (W2) as measured in the X direction. The second width (W2) is different than the first width (W1). In one embodiment, Metal-1 horizontal lines 1351-1361 corresponding to Metal-1 conductive structures are shown by the dashed rectangles. In one embodiment, the Metal-1 horizontal lines 1351-1361 are centered on a fixed pitch (M1P) as measured in the Y direction.

Figure 14:
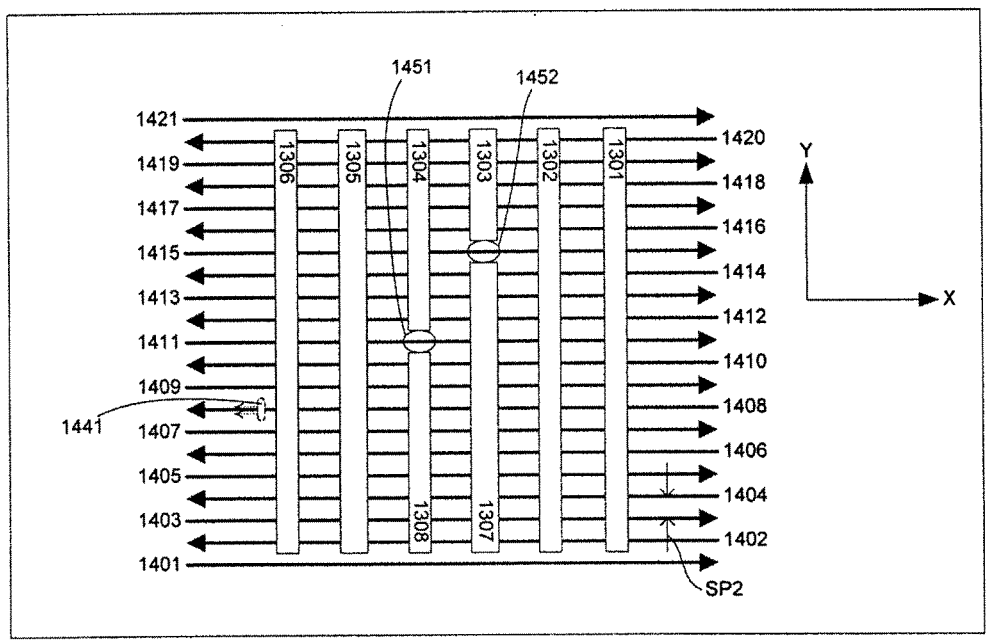
FIG. 14 shows a plan view of a possible scan pattern used to write the gate lines in the example circuit of FIG. 13, in accordance with one embodiment of the present invention.

FIG. 14 shows a plan view of a possible scan pattern used to write the gate lines 1301-1308 in the example circuit of FIG. 13, in accordance with one embodiment of the present invention. The scan pattern includes scan lines 1401-1421. The retrace lines are not shown in FIG. 14 to avoid cluttering the figure. However, it should be understood that the retrace lines in the example of FIG. 14 could be implemented in a manner similar to that shown in the example embodiments of either FIG. 2 or FIG. 3. The scan lines 1401-1421 are oriented in the horizontal direction (X direction) and may extend to the left and/or right of the logic/memory cell or row of logic/memory cells in which the example circuit is formed. In this example embodiment, the scan direction is perpendicular to a length direction of the gate lines 1301-1308.

The example scan pattern shown in FIG. 14 has a scan pitch (SP2) as measured in the Y direction that is one-half (½) of the Metal-1 pitch (M1P) as measured in the Y direction. A scan beam cross-section 1441 size as measured in the Y direction is equal to a width of a scan line (about one-half (½) of the Metal-1 pitch (M1P)) plus some small extension (e.g., 1 nm to 5 nm, by way of example) to account for overlay as the beam is scanned side-to-side.

As shown in FIG. 14, scan lines 1402-1419 require switching of the beam ("on" for negative photoresist, "off" for positive photoresist) to produce portions of the gate lines 1301-1308. Also, scan lines 1401 and 1421 do not require switching of the beam. Each of scan lines 1402-1420 is switched to create portions of the gate lines 1301-1308 of the different widths W1, W2. Also, each of scan lines 1411 and 1415 is switched to create end gaps 1451 and 1452, respectively. In this embodiment, the beam switching has a sufficient temporal resolution to allow for writing/creating the portions of the gate lines 1301-1308 of different widths W1, W2.

It should be appreciated that the scan pitch (SP2), i.e., raster size, of one-half (½) of the Metal-1 pitch (M1P) (e.g., SP2=35 nm for 22 nm CMOS node) is still relatively coarse as compared to a 1 nm or finer scan pitch that is required to draw/form conventional gate lines. It should also be appreciated that while the scan pitch (SP2) is not as large, i.e., coarse, as the scan pitch shown in the examples of FIG. 2 or 3, the scan pitch (SP2) and corresponding scan pattern of FIG. 14 allow for writing/creating lines of different widths, as measured in the scan direction, which can be important in forming gate lines and/or diffusion/active regions. In one embodiment, in order to control the beam switching precisely enough to provide sufficient critical dimension (CD) control as required for gate electrode formation, the beam scanning may be performed in a uni-directional manner, as opposed to the bi-directional manner shown in FIG. 14.

Figure 15:
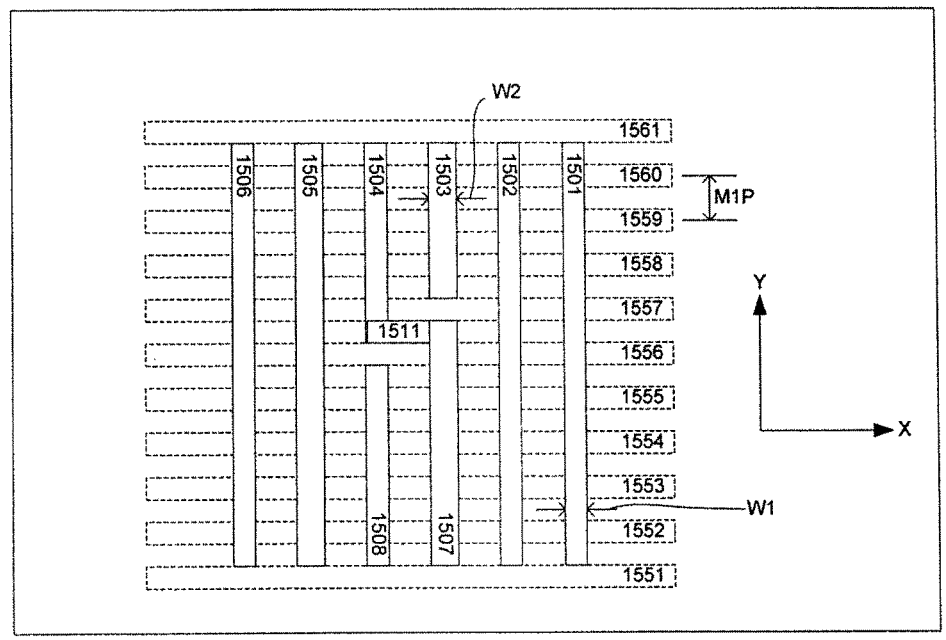
FIG. 15 shows a plan view of a portion of a gate electrode layer of an example circuit that includes non-uniform gate line widths and a conductive line segment oriented perpendicular to the gate lines, in accordance with one embodiment of the present invention.

FIG. 15 shows a plan view of a portion of a gate electrode layer of an example circuit that includes non-uniform gate line widths and a conductive line segment oriented perpendicular to the gate lines, in accordance with one embodiment of the present invention. The portion of the gate electrode layer includes gate lines 1501-1508. It should be understood that the gate lines 1501-1508 correspond to conductive structures formed within the portion of the gate electrode layer. Each gate line 1501-1508 is defined to extend lengthwise in a first direction Y. Gate lines 1501, 1502, 1504, 1506, 1508 have a first width (W1) as measured in the X direction. Gate lines 1503, 1505, 1507 have a second width (W2) as measured in the X direction. The second width (W2) is different than the first width (W1). The portion of the gate electrode layer also includes the conductive line segment 1511 oriented in the X direction perpendicular to the gate lines 1501-1508, so as to extend between and contact gate lines 1504 and 1507. It should be understood that the conductive line segment 1511 corresponds to a conductive structure formed within the portion of the gate electrode layer. In one embodiment, Metal-1 horizontal lines 1551-1561 corresponding to Metal-1 conductive structures are shown by the dashed rectangles. In one embodiment, the Metal-1 horizontal lines 1551-1561 are centered on a fixed pitch (M1P) as measured in the Y direction.

Figure 16:
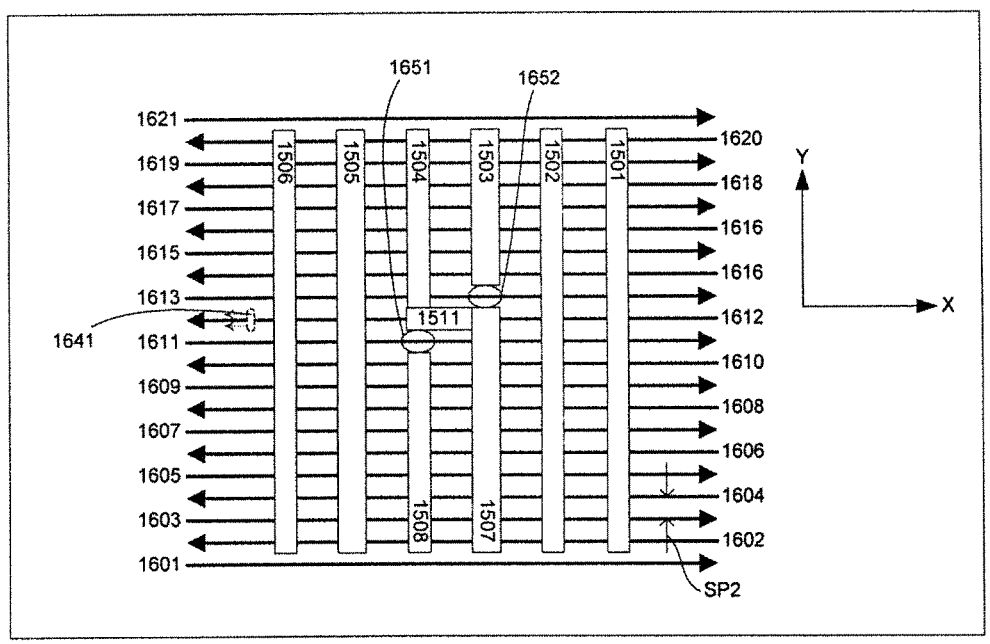
FIG. 16 shows a plan view of a possible scan pattern used to write the gate lines in the example circuit of FIG. 15, in accordance with one embodiment of the present invention.

FIG. 16 shows a plan view of a possible scan pattern used to write the gate lines 1301-1308 in the example circuit of FIG. 15, in accordance with one embodiment of the present invention. The scan pattern includes scan lines 1601-1621. The retrace lines are not shown in FIG. 16 to avoid cluttering the figure. However, it should be understood that the retrace lines in the example of FIG. 16 could be implemented in a manner similar to that shown in the example embodiments of either FIG. 2 or FIG. 3. The scan lines 1601-1621 are oriented in the horizontal direction (X direction) and may extend to the left and/or right of the logic/memory cell or row of logic/memory cells in which the example circuit is formed. In this example embodiment, the scan direction is perpendicular to a length direction of the gate lines 1501-1508.

The example scan pattern shown in FIG. 16 has a scan pitch (SP2) as measured in the Y direction that is one-half (½) of the Metal-1 pitch (M1P) as measured in the Y direction. In one embodiment, a scan beam cross-section 1641 size as measured in the Y direction is equal to a width of a scan line (about one-half (½) of the Metal-1 pitch (M1P)) plus some small extension (e.g., 1 nm to 5 nm, by way of example) to account for overlay as the beam is scanned side-to-side.

As shown in FIG. 16, scan lines 1602-1619 require switching of the beam ("on" for negative photoresist, "off" for positive photoresist) to produce portions of the gate lines 1501-1508 and the conductive line segment 1511. Also, scan lines 1601 and 1621 do not require switching of the beam. Each of scan lines 1602-1620 is switched to create portions of the gate lines 1501-1508 of the different widths W1, W2. Also, each of scan lines 1611 and 1613 is switched to create end gaps 1651 and 1652, respectively. Also, scan line 1612 is switched to create the conductive line segment 1511. It should be appreciated that in this manner the beam can be switched to create line segments that extend in a lengthwise direction perpendicular to the gate lines 1501-1508.

In one embodiment, the line-width of the conductive line segment 1511 as measured in the Y direction is determined by the beam cross-section size as measured in the Y direction. In this embodiment, the line-width of the conductive line segment 1511 as measured in the Y direction is substantially equal to one-half (½) of the Metal-1 pitch (M1P), since the line-width of the conductive line segment 1511 is defined by the width of the beam as measured in the Y direction, as opposed to the temporal accuracy of the beam switching. However, in this embodiment, it should be understood that the beam switching has a sufficient temporal resolution to allow for writing/creating the portions of the gate lines 1501-1508 of different widths W1, W2, the end gaps 1651, 1652, and the perpendicularly oriented (in the X direction) conductive line segment 1511.

It should be appreciated that the scan pitch (SP2), i.e., raster size, of one-half (½) of the Metal-1 pitch (M1P) (e.g., SP2=35 nm for 22 nm CMOS node) is still relatively coarse as compared to a 1 nm or finer scan pitch that is required to draw/form conventional gate lines. It should be also appreciated that while the scan pitch (SP2) is not as large, i.e., coarse, as the scan pitch shown in the examples of FIG. 2 or 3, the scan pitch (SP2) and corresponding scan pattern of FIG. 16 allows for writing/creating lines of different widths, as measured in the scan direction, which can be important in forming gate lines and/or diffusion/active regions. Also, the scan pitch (SP2) allows for writing/creating line segments that are oriented perpendicular to the gate lines 1501-1508, i.e., that are oriented parallel to the scan direction. Additionally, the scan pitch (SP2) allows for cutting of gate lines to form eng gaps, such as end gaps 1651 and 1652. In one embodiment, in order to control the beam switching precisely enough to provide sufficient critical dimension (CD) control as required for gate electrode formation, the beam scanning may be performed in a uni-directional manner, as opposed to the bi-directional manner shown in FIG. 16.

The Dynamic Array Architecture developed by Tela Innovations, Inc., is described in part in U.S. Pat. No. 7,446,352, entitled "Dynamic Array Architecture," and in part in U.S. Pat. No. 7,917,879, entitled "Semiconductor Device with Dynamic Array Section," each of which is incorporated herein by reference in its entirety. Use of the Dynamic Array Architecture implemented with "lines" and "cuts," as discussed herein, can force all features onto a "coarse grid." For example, all gate electrode cuts can be on a gate pitch, so a beam writer (laser or electron) would only need to make one pass along the direction of a gate line to write the cuts. Since the gate pitch is about 80 nm for the 22 nm CMOS node, an improvement in write time by a factor of 80 or more can be realized as compared to a 1 nm grid. Further improvements in write time can be achieved with parallel or multiple beams. Also, worse-case layers like the diffusion/active layer could be designed with granular widths and locations such that it could be written with a relatively coarse grid. For example, using a grid of one-eighth (⅛) of the Metal-1 pitch would allow writing the pattern about 10 times faster than with a 1 nm fine grid. Also, "hole" patterns such as contact and via-N can be placed on a coarse grid layout within the Dynamic Array Architecture.

It should be further appreciated that the coarse grid methods described herein are scalable through use of multiple patterning. For example, lines can be created using "Spacer Double Patterning" once or multiple times to achieve pitch division by 2 (PD2), 4 (PD4), 8 (PD8), etc., and achieve line pitches of 30 nm and below. In one example, at the 22 nm CMOS technology node, the Metal-1 pitch is about 70 nm, with a Metal-1 width of about 36 nm and a Metal-1-to-Metal-1 spacing of about 34 nm. This Metal-1 pitch and sizing cannot be directly patterned with 193 immersion lithography, but can be patterned using PD2 spacer double patterning.

In one embodiment, a relaxed version the Dynamic Array Architecture can be implemented in which all lines and holes are written with a coarse beam which makes two passes per pitch. This will allow the beam to write lines or cuts in either the normal line channel or the normal space channel. This embodiment may cause a reduction in throughput, but may be useful for special layout cases.

As mentioned above, the invention described herein can use the Tela Innovations, Inc., Dynamic Array Architecture (i.e., gridded design style). However, it should be understood that the invention is not limited to the Dynamic Array Architecture design style. Also, while CMOS transistors may be formed in accordance with the examples described herein, it should be understood that other components can be formed in an analogous fashion. It should also be noted that the Dynamic Array Architecture can be implemented with a coarse grid in the X and Y directions to facilitate identification of the locations of objects like transistors, contacts, and gaps in lines, i.e., linear conductive structures. The linear conductive structures can be positioned on and/or according to the grids.

Figure 17:
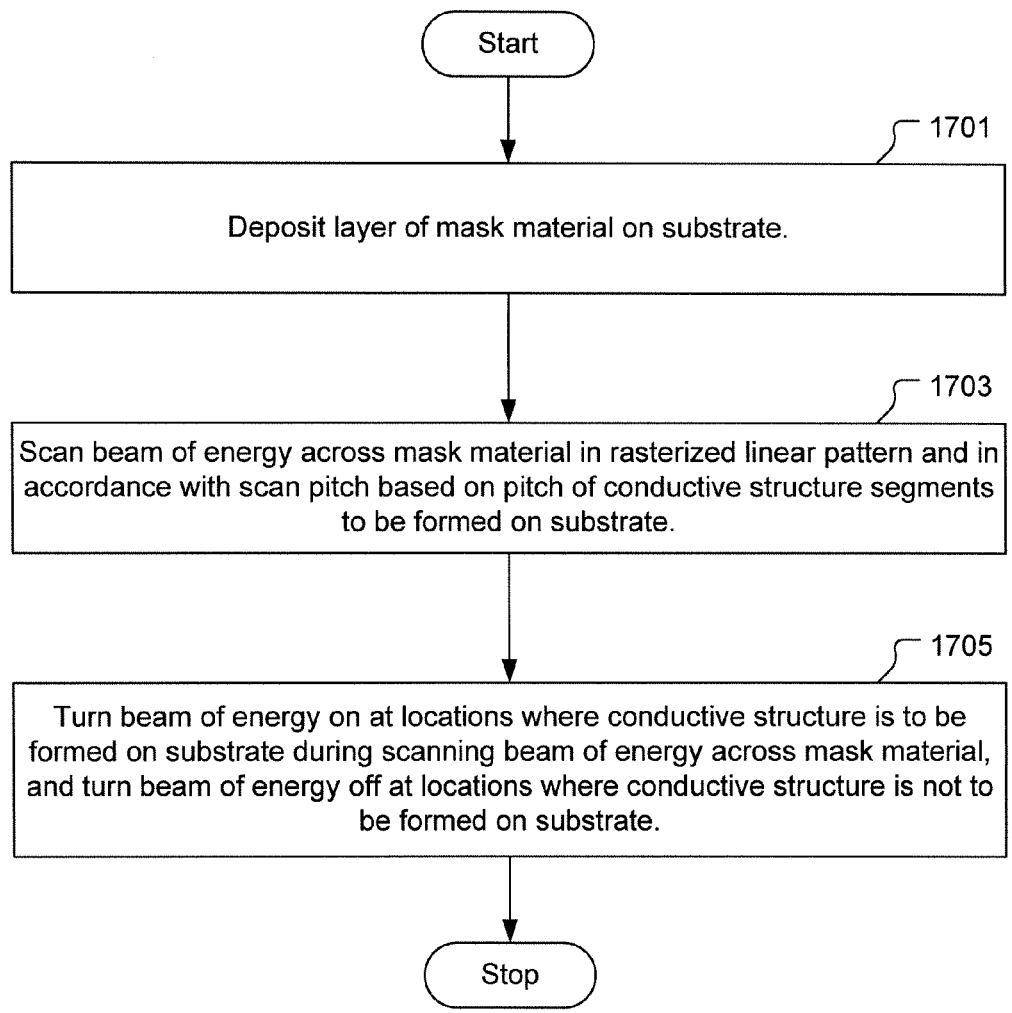
FIG. 17 shows a flowchart of a method of fabricating an integrated circuit, in accordance with one embodiment of the present invention.

FIG. 17 shows a flowchart of a method of fabricating an integrated circuit, in accordance with one embodiment of the present invention. The method includes an operation 1701 for depositing a layer of a mask material on a substrate. In one embodiment, the mask material is a photoresist material. The method also includes an operation 1703 for scanning a beam of energy across the mask material in a rasterized linear pattern and in accordance with a scan pitch that is based on a pitch of conductive structure segments to be formed on the substrate. In one embodiment, the beam of energy is defined to transform the mask material upon which the beam of energy is incident into a removable state. In various embodiments, the beam of energy is either an electron beam or a laser beam. The method further includes an operation 1705 for turning the beam of energy on at locations where a conductive structure is to be formed on the substrate during scanning the beam of energy across the mask material. Also, in operation 1705, the beam of energy is turned off at locations where a conductive structure is not to be formed on the substrate.

In one embodiment, the scan pitch is equal to and aligned with the pitch of conductive structure segments to be formed on the substrate. In one instance of this embodiment, the conductive structure segments to be formed on the substrate are gate level conductive structure segments. Also, some of the gate level conductive structure segments form one or more transistor gate electrodes.

In one embodiment, the scan pitch is one-half of a gate electrode pitch, and the scan pitch is aligned with the gate electrode pitch. In one instance of this embodiment, the conductive structure segments to be formed on the substrate are contact structures. The contact structures can include at least one gate contact and at least one diffusion contact.

In one embodiment, the scan pitch is equal to and aligned with an interconnect level conductive structure pitch. In one instance of this embodiment, the conductive structure segments to be formed on the substrate are interconnect level conductive structures. In another instance of this embodiment, the conductive structure segments to be formed on the substrate are via structures.

Figure 18:
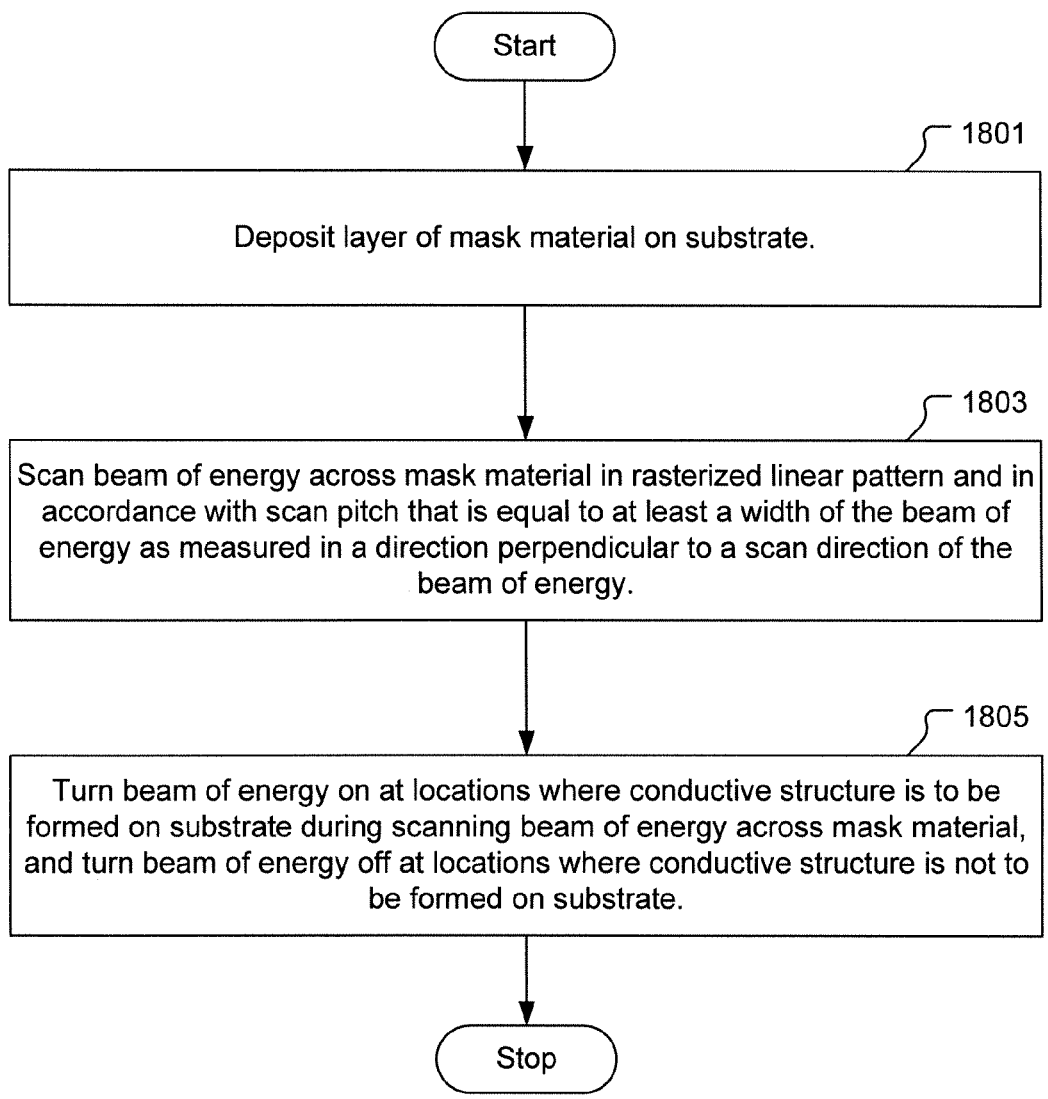
FIG. 18 shows a flowchart of a method of fabricating an integrated circuit, in accordance with one embodiment of the present invention.

FIG. 18 shows a flowchart of a method of fabricating an integrated circuit, in accordance with one embodiment of the present invention. The method includes an operation 1801 for depositing a layer of a mask material on a substrate. In one embodiment, the mask material is a photoresist material. The method also includes an operation 1803 for scanning a beam of energy across the mask material in a rasterized linear pattern and in accordance with a scan pitch that is equal to at least a width of the beam of energy as measured in a direction perpendicular to a scan direction of the beam of energy. In various embodiments, the beam of energy is either an electron beam or a laser beam. In one embodiment, the scan pitch is substantially equal to the width of the beam of energy. In one embodiment, the beam of energy is defined to transform the mask material upon which the beam of energy is incident into a removable state. The method further includes an operation 1805 for turning the beam of energy on at locations where a conductive structure is to be formed on the substrate during scanning the beam of energy across the mask material. The operation 1805 also includes turning the beam of energy off at locations where a conductive structure is not to be formed on the substrate.

In one embodiment, the beam of energy is turned on as the beam of energy is scanned perpendicularly across locations corresponding to a pitch of conductive structure segments to be formed on the substrate. The method can also include an operation for controlling a time period during which the beam of energy is turned on at each location corresponding to the pitch of conductive structure segments to be formed on the substrate, so as to control a width of the conductive structure segments to be formed on the substrate. Also, the method can include an operation for turning the beam of energy on between one or more locations corresponding to the pitch of conductive structure segments to be formed on the substrate, so as to transform the mask material between the one or more locations to provide for formation of a conductive structure that extends between the one or more locations.

It should be understood that in one embodiment the invention described herein can be embodied as computer readable code on a computer readable medium. For example, the computer readable code can include computer executable program instructions for operating the energy beam scanner. The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the methods disclosed herein can be used to manufacture part of a semiconductor device or chip. In the fabrication of semiconductor devices such as integrated circuits, memory cells, and the like, a series of manufacturing operations are performed to define features on a semiconductor wafer, i.e., substrate. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method of fabricating an integrated circuit, comprising:
   depositing a layer of a mask material on a substrate;
   scanning a beam of energy across the mask material in a rasterized linear pattern and in accordance with a scan pitch that is based on a pitch of conductive structure segments to be formed on the substrate, wherein the beam of energy is defined to transform the mask material upon which the beam of energy is incident into a removable state; and
   during scanning the beam of energy across the mask material, turning the beam of energy on at locations where a conductive structure is to be formed on the substrate, and turning the beam of energy off at locations where a conductive structure is not to be formed on the substrate.

2. The method of claim 1, wherein the scan pitch is equal to and aligned with the pitch of conductive structure segments to be formed on the substrate.

3. The method of claim 2, wherein the conductive structure segments to be formed on the substrate are gate level conductive structure segments.

4. The method of claim 3, wherein some of the gate level conductive structure segments form one or more transistor gate electrodes.

5. The method of claim 1, wherein the scan pitch is one-half of a gate electrode pitch, and wherein the scan pitch is aligned with the gate electrode pitch.

6. The method of claim 5, wherein the conductive structure segments to be formed on the substrate are contact structures.

7. The method of claim 6, wherein the contact structures include at least one gate contact and at least one diffusion contact.

8. The method of claim 1, wherein the scan pitch is equal to and aligned with an interconnect level conductive structure pitch.

9. The method of claim 8, wherein the conductive structure segments to be formed on the substrate are interconnect level conductive structures.

10. The method of claim 8, wherein the conductive structure segments to be formed on the substrate are via structures.

11. The method of claim 1, wherein the beam of energy is an electron beam.

12. The method of claim 1, wherein the beam of energy is a laser beam.

13. The method of claim 1, wherein the mask material is a photoresist material.

14. A method of fabricating an integrated circuit, comprising:
depositing a layer of a mask material on a substrate;
scanning a beam of energy across the mask material in a rasterized linear pattern and in accordance with a scan pitch that is equal to at least a width of the beam of energy as measured in a direction perpendicular to a scan direction of the beam of energy, wherein the beam of energy is defined to transform the mask material upon which the beam of energy is incident into a removable state; and
during scanning the beam of energy across the mask material, turning the beam of energy on at locations where a conductive structure is to be formed on the substrate, and turning the beam of energy off at locations where a conductive structure is not to be formed on the substrate.

15. The method of claim 14, wherein the scan pitch is substantially equal to the width of the beam of energy.

16. The method of claim 14, wherein the beam of energy is turned on as the beam of energy is scanned perpendicularly across locations corresponding to a pitch of conductive structure segments to be formed on the substrate.

17. The method of claim 16, further comprising:
controlling a time period during which the beam of energy is turned on at each location corresponding to the pitch of conductive structure segments to be formed on the substrate so as to control a width of the conductive structure segments to be formed on the substrate.

18. The method of claim 17, further comprising:
turning the beam of energy on between one or more locations corresponding to the pitch of conductive structure segments to be formed on the substrate so as to transform the mask material between the one or more locations to provide for formation of a conductive structure that extends between the one or more locations.

19. The method of claim 14, wherein the beam of energy is either an electron beam or a laser beam.

20. The method of claim 14, wherein the mask material is a photoresist material.

* * * * *